United States Patent
Watakabe et al.

(10) Patent No.: US 11,894,387 B2
(45) Date of Patent: Feb. 6, 2024

(54) SEMICONDUCTOR DEVICE

(71) Applicant: Japan Display Inc., Tokyo (JP)

(72) Inventors: Hajime Watakabe, Tokyo (JP); Toshihide Jinnai, Tokyo (JP); Ryo Onodera, Tokyo (JP); Akihiro Hanada, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 17/747,049

(22) Filed: May 18, 2022

(65) Prior Publication Data
US 2022/0278137 A1    Sep. 1, 2022

Related U.S. Application Data

(63) Continuation of application No. 16/986,462, filed on Aug. 6, 2020, now Pat. No. 11,362,113.

(30) Foreign Application Priority Data

Aug. 26, 2019   (JP) .................................. 2019-153539

(51) Int. Cl.
*H01L 27/00*      (2006.01)
*H01L 29/00*      (2006.01)
(Continued)

(52) U.S. Cl.
CPC ...... *H01L 27/1225* (2013.01); *H01L 27/1285* (2013.01); *H01L 29/66742* (2013.01); *H01L 29/7869* (2013.01)

(58) Field of Classification Search
CPC ............. H01L 27/1225; H01L 27/1285; H01L 27/1237; H01L 29/66742; H01L 29/7869; H01L 29/4908; H01L 29/78633
See application file for complete search history.

(56) References Cited

U.S. PATENT DOCUMENTS 10,276,722 B2 *   4/2019   Yoshitani .............. H01L 29/512
11,009,758 B2 *   5/2021   Chikama ........... G02F 1/133514
(Continued)

FOREIGN PATENT DOCUMENTS

| JP | 2016-136629 A | 7/2016 |
| JP | 2017-175022 A | 9/2017 |
| JP | 2018-125340 A | 8/2018 |

OTHER PUBLICATIONS

Japanese Office Action dated Jun. 27, 2023 for the corresponding Japanese Application No. 2019-153539, with English machine translation.

*Primary Examiner* — Nikolay K Yushin
(74) *Attorney, Agent, or Firm* — Michael Best & Friedrich LLP

(57) ABSTRACT

There is provided a technique that enables a reduction in the display failure of a display device and the improvement of the yields of the display device in a display device that adopts a semiconductor device including a thin film transistor using an oxide semiconductor. A semiconductor device according to an embodiment includes a thin film transistor having an oxide semiconductor. The oxide semiconductor has a drain region, a source region, and a channel region provided between the drain region and the source region. The thin film transistor includes a gate insulating film provided on the channel region, an aluminum oxide film provided on the gate insulating film, an insulating film provided on the aluminum oxide film, and a gate electrode provided on the insulating film.

8 Claims, 23 Drawing Sheets

(51) Int. Cl.
*H01L 27/12* (2006.01)
*H01L 29/66* (2006.01)
*H01L 29/786* (2006.01)

(56) References Cited

U.S. PATENT DOCUMENTS

2012/0187395 A1   7/2012   Koezuka
2017/0278974 A1*  9/2017   Yoshitani .............. H01L 29/518
2018/0219029 A1   8/2018   Hanyu et al.
2019/0377210 A1* 12/2019   Chikama ........... G02F 1/133512

* cited by examiner

FIG.3
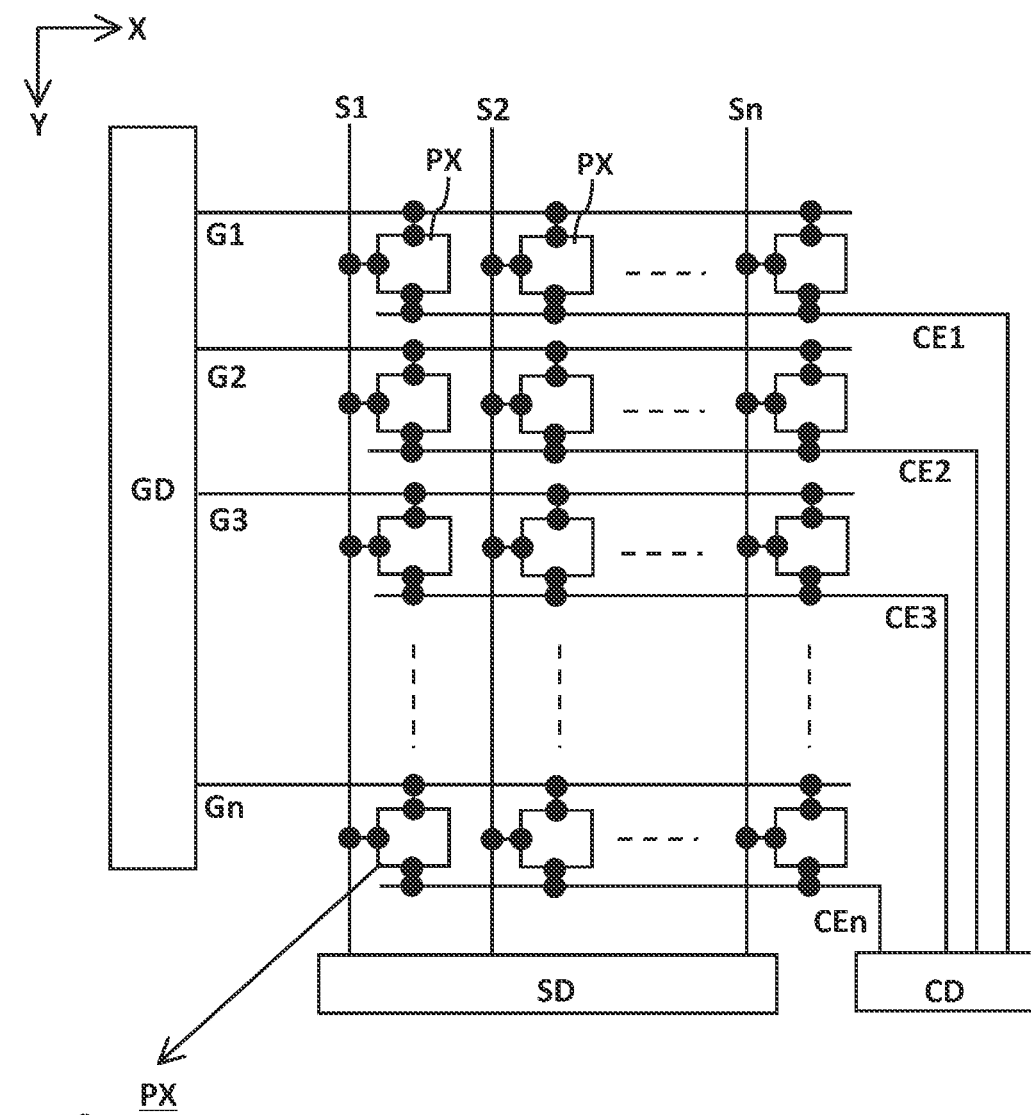
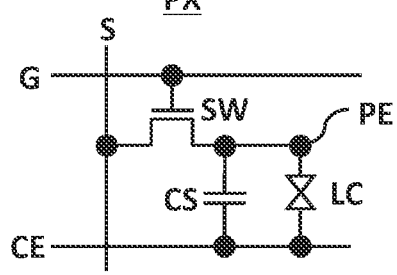

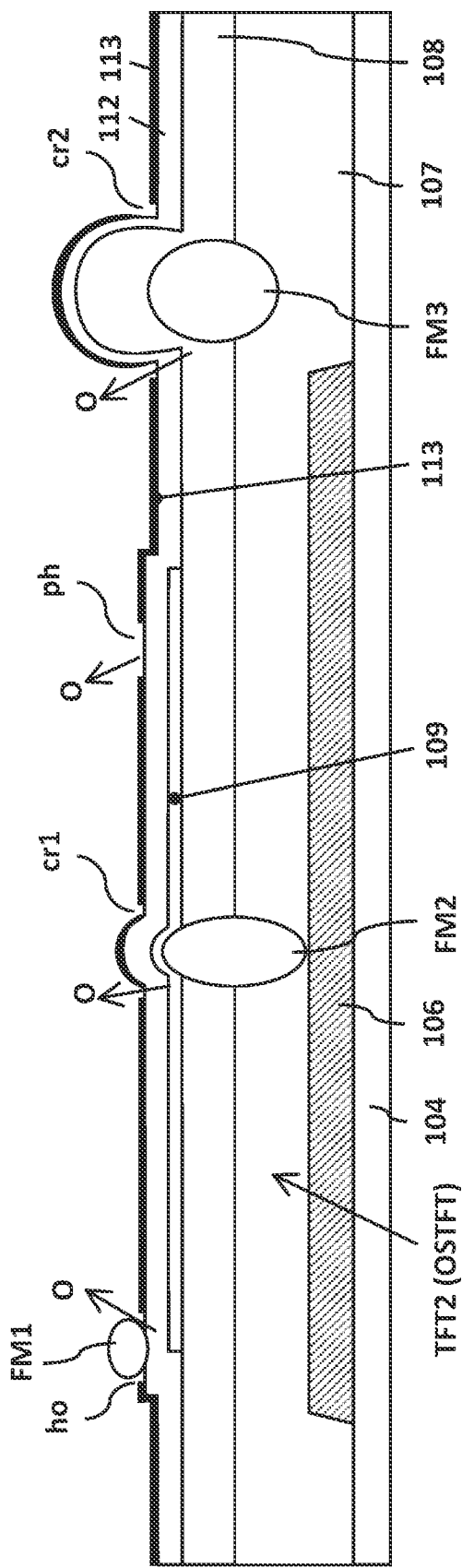

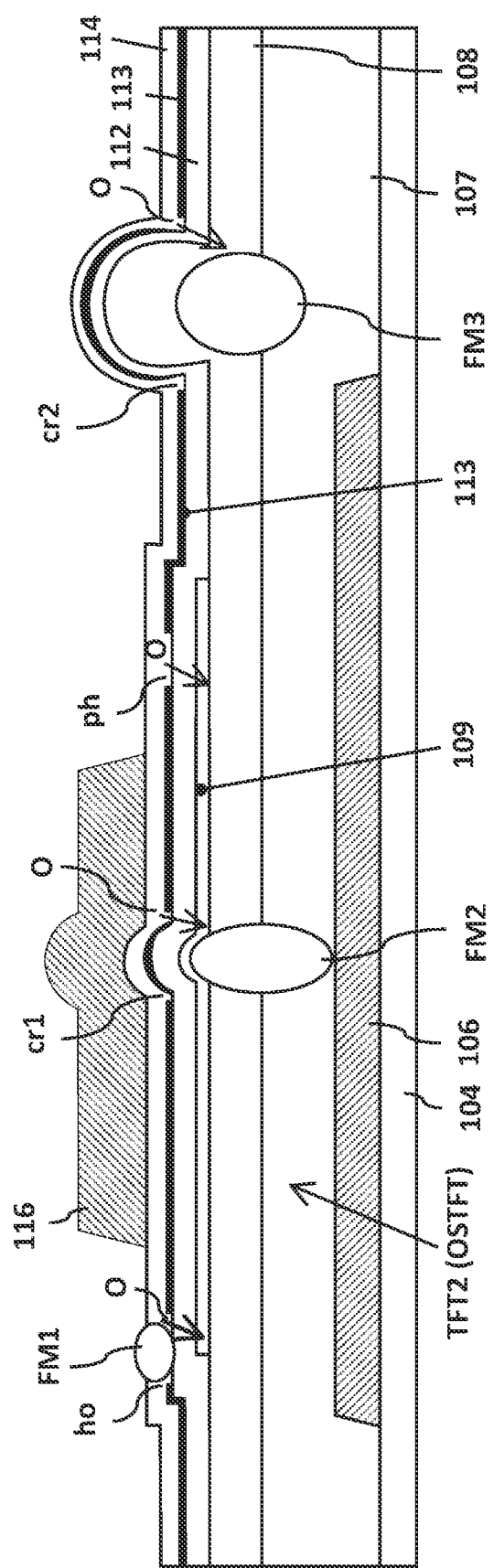

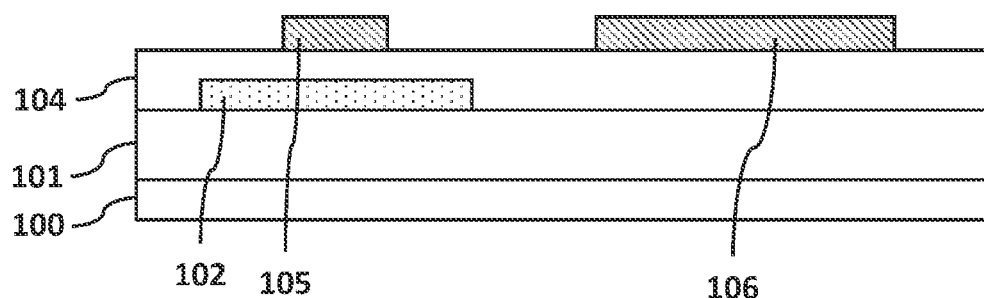
FIG.8
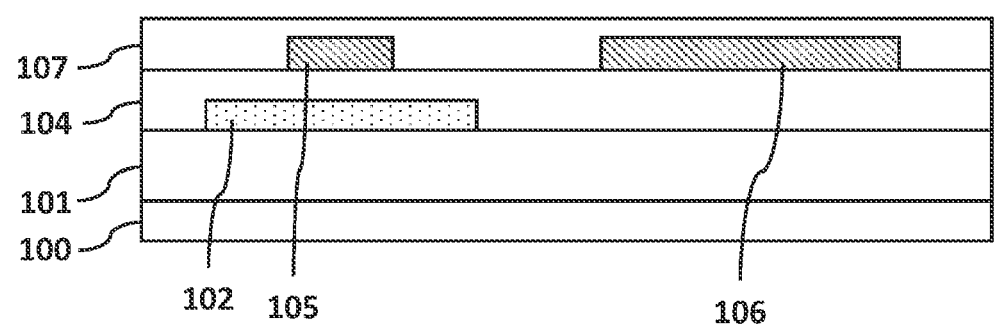
FIG.9
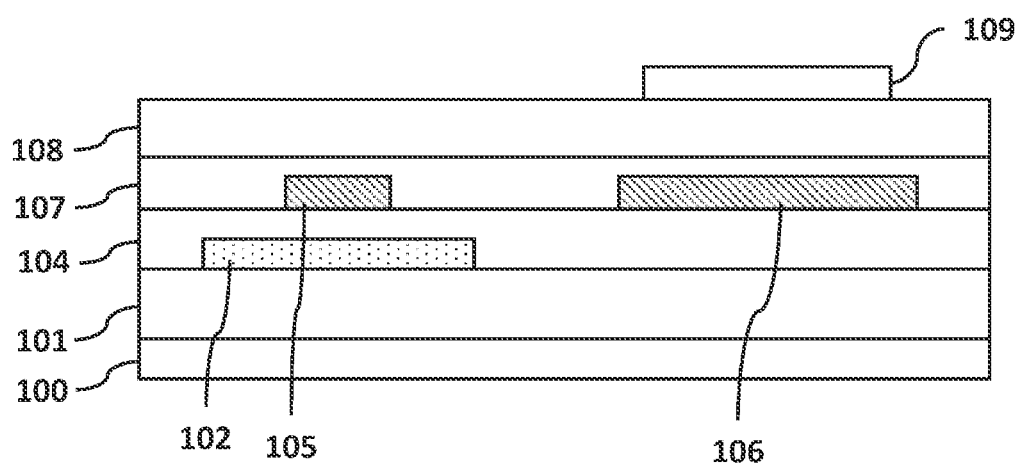

SEMICONDUCTOR DEVICE

CLAIM OF PRIORITY

This application is a continuation of U.S. patent application Ser. No. 16/986,462, filed on Aug. 6, 2020. Further, this application claims priority from Japanese Patent Application JP 2019-153539 filed on Aug. 26, 2019, the entire contents of which are hereby incorporated by reference into this application.

BACKGROUND OF THE INVENTION

The present invention relates to a semiconductor device, and more particularly to a semiconductor device, such as a display device having a thin film transistor using an oxide semiconductor.

A liquid crystal display device is configured in which a TFT substrate is formed with pixels in a matrix configuration, the pixel has a pixel electrode, a thin film transistor (TFT), and other components, a counter substrate is disposed opposite to the TFT substrate, and a liquid crystal is sandwiched between the TFT substrate and the counter substrate. The optical transmittance of liquid crystal molecules is controlled at every pixel, and thus images are formed.

Since a TFT using an oxide semiconductor has a small leakage current, this TFT is suitable as a switching TFT in a pixel region. The switching TFT in the pixel region has to have a small leakage current. The switching TFT in the pixel region is requested to have a large ON current. That is, in the case where the switching TFT in the pixel region is configured with a TFT using an oxide semiconductor, a sufficiently large resistance has to be maintained in a channel region, whereas resistance has to be sufficiently small in a source region and a drain region.

Japanese Unexamined Patent Application Publication No. 2017-126693 discloses a semiconductor device formed with a thin film transistor (TR1) having a first semiconductor layer made of polysilicon and a thin film transistor (TR2) having a second semiconductor layer made of metal oxide.

SUMMARY OF THE INVENTION

The present inventors have investigated that in the case where a switching TFT in a pixel region is configured with a TFT using an oxide semiconductor, the oxide semiconductor is oxidized using an aluminum oxide film (in the following, referred to as an AlO film). In the case where an AlO film is bored with a hole or cracked due to foreign substances in the cause of manufacturing processes, oxygen injected into a gate insulating film is dissipated, and the oxidation of the oxide semiconductor as an active layer sometimes fails. Therefore, in the display device that adopts a semiconductor device including a thin film transistor using an oxide semiconductor, a problem arises in that the properties of the TFT using an oxide semiconductor are shifted to the negative side and this shift causes display failure in the display panel of the display device.

An object of the present invention is to provide a technique that enables a reduction in the display failure of a display device and the improvement of the yields of the display device in a display device that adopts a semiconductor device including a thin film transistor using an oxide semiconductor.

Other problems and novel characteristics will be apparent from the description and the accompanying drawings of the present specification.

The following is the brief summary of representative aspects of the present invention.

That is, a semiconductor device according to an embodiment includes a thin film transistor having an oxide semiconductor. The oxide semiconductor has a drain region, a source region, and a channel region provided between the drain region and the source region. The thin film transistor includes a gate insulating film provided on the channel region, an aluminum oxide film provided on the gate insulating film, an insulating film provided on the aluminum oxide film, and a gate electrode provided on the insulating film.

A semiconductor device according to an embodiment includes a substrate, a first thin film transistor provided on the substrate, the first thin film transistor being made of polysilicon, and a second thin film transistor provided on the substrate, the second thin film transistor being made of an oxide semiconductor. The oxide semiconductor of the second thin film transistor has a drain region, a source region, and a channel region provided between the drain region and the source region. The second thin film transistor includes a gate insulating film provided on the channel region, an aluminum oxide film provided on the gate insulating film, an insulating film provided on the aluminum oxide film, and a gate electrode provided on the insulating film.

A method of manufacturing a semiconductor device according to an embodiment is a method of manufacturing a semiconductor device including a thin film transistor having a semiconductor layer of an oxide semiconductor including a drain region, a source region, and a channel region provided between the drain region and the source region, the method including the steps of: selectively forming the semiconductor layer on a substrate; forming a gate insulating film such that the gate insulating film is located on the channel region in the semiconductor layer; forming an aluminum oxide film on the gate insulating film; forming an insulating film on the aluminum oxide film; oxidizing the channel region in the semiconductor layer using oxygen; forming a gate electrode on the insulating film; and performing ion implantation using the gate electrode as a mask to impart electrical conductivity to the drain region and the source region in the semiconductor layer.

BRIEF DESCRIPTION OF THE DRAWINGS

FIG. 3 is a view showing the basic configuration of pixels and the equivalent circuit of the display device;

FIG. 5 is a cross sectional view showing the main components of a semiconductor device according to a comparative example;

FIG. 6 is a cross sectional view showing the main components of the semiconductor device having a third insulating film;

FIG. 7 is a cross sectional view showing a state where a first gate electrode and a light-shielding film are formed;

FIG. 8 is a cross sectional view showing a state where a first insulating film is formed;

FIG. 9 is a cross sectional view showing a state where a second semiconductor layer is formed;

DETAILED DESCRIPTION OF THE PREFERRED EMBODIMENTS

Figure 1:
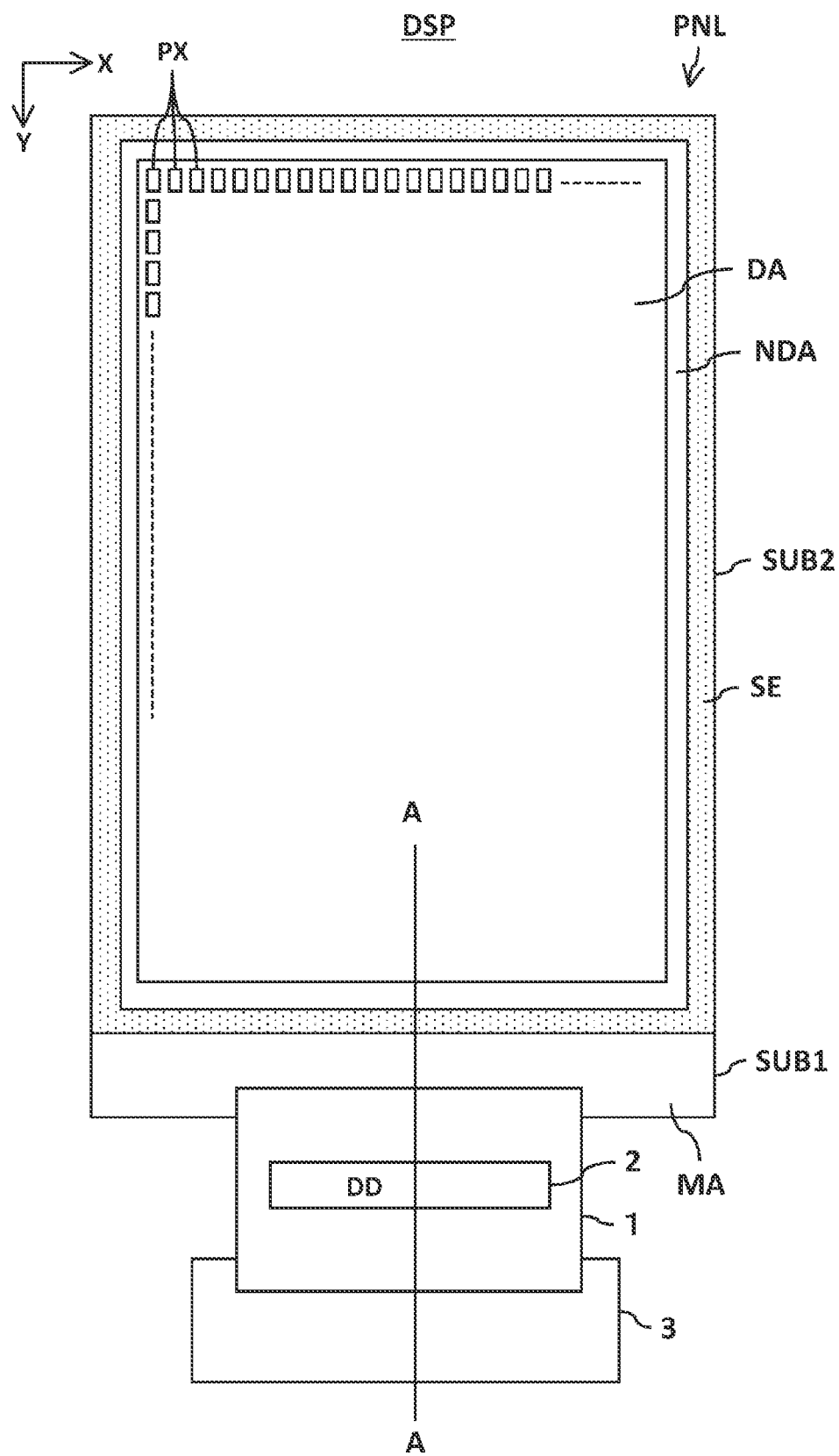
FIG. 1 is a plan view showing the appearance of a display device according to an embodiment.

In the following, embodiments according to the present invention will be described with reference to the drawings.

Note that the disclosure is merely examples, and appropriate modifications that can be easily conceived by a person skilled in the art within the gist of the present invention are naturally included in the scope of the present invention. For more clarity of the description, in the drawings, the width, thickness, shapes, and other parameters of components are sometimes schematically depicted compared with actual forms, which are, however, merely examples and do not limit the interpretation of the present invention.

In the present specification and the drawings, components similar to the components already described are designated with the same reference signs, and the detailed description is sometimes appropriately omitted.

In the present embodiment, as an example of display devices, a liquid crystal display device is disclosed. This liquid crystal display device can be used for various devices, for example, smartphones, tablet terminals, mobile telephone terminals, personal computers, television sets, on-vehicle devices, game machines, and other devices.

Note that in the present specification and claims, the representation, such as "above" and "below", when the drawings are described represents the relative positional relationship between a structure on which attention is focused and another structure. More specifically, in the case where the structure is viewed from the side surface, the direction from a first substrate (array substrate) to a second substrate (counter substrate) is defined as "above", and the opposite direction is defined as "below".

The terms "inner side" and "outer side" express relative positional relationships between two parts based on a display region. That is, the term "inner side" expresses the side relatively close to the display region with respect to one part, and the term "outer side" expresses the side relatively apart from the display region with respect to one part. However, the definitions of the terms "inner side" and "outer side" referred here are provided in the state where the liquid crystal display device is not bent.

The term "display device" expresses a general display device that displays pictures using a display panel. The term "display panel" expresses a structure that displays pictures using an electrooptic layer. For example, the term "display panel" sometimes expresses a display cell includes an electrooptic layer, and sometimes expresses a structure in which another optical member (e.g. a polarization member, a backlight, a touch panel, and other components) is installed on a display cell. Here, the term "electrooptic layer" possibly includes a liquid crystal layer, an electrochromic (EC) layer, and other layers except where no technical contradiction occurs. Therefore, an embodiment, described later, will be described with an example of a liquid crystal panel including a liquid crystal layer as a display panel. However, applications on display panels including above-described other electrooptic layers are not excluded.

EMBODIMENT

Overall Structure Example of Display Device

Figure 2:
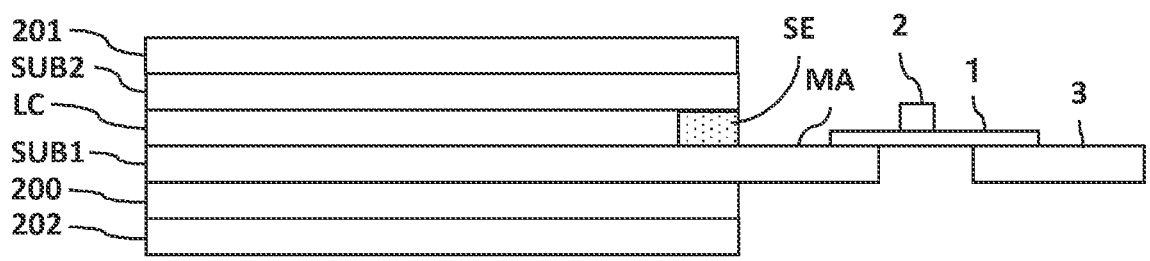
FIG. 2 is a cross sectional view taken along line A-A in FIG. 1.

FIG. 1 is a plan view showing the appearance of a display device according to an embodiment. FIG. 2 is a cross sectional view taken along line A-A in FIG. 1. In FIGS. 1 and 2, a display device DSP includes a display panel PNL, a flexible printed circuit board 1, an IC chip 2, and a circuit board 3.

The display panel PNL is a liquid crystal display panel, and includes a first substrate (also referred to as a TFT substrate or an array substrate) SUB1, a second substrate (also referred to as a counter substrate) SUB2, a liquid crystal layer LC, and a sealing material SE.

The display panel PNL includes a display part (display region) DA that displays images and a non-display part (non-display region) NDA in a picture frame shape that surrounds the outer region of the display part DA. The second substrate SUB2 is opposite to the first substrate SUB1. The first substrate SUB1 has a mounting region MA extending in a second direction Y from the second substrate SUB2. The sealing material SE is located in the non-display part NDA, attaches the first substrate SUB1 to the second substrate SUB2, and seals the liquid crystal layer LC.

Referring to FIG. 2, a lower polarizer 200 is attached to the underside of the first substrate SUB, and an upper polarizer 201 is attached to the upper side of the second substrate SUB2. The combination of the first substrate SUB1, the second substrate SUB2, the lower polarizer 200, the upper polarizer 201, and the liquid crystal layer LC is referred to as the display panel PNL. Since the display panel PNL does not emit light by itself, a backlight 202 is disposed on its back surface.

In the mounting region MA, a plurality of external terminals are formed. To the plurality of external terminals in the mounting region MA, the flexible printed circuit board 1 is connected. On the flexible printed circuit board 1, a driver IC2 that supplies picture signals and other signals is installed. To the flexible printed circuit board 1, the circuit board 3 that externally supplies signals and electric power to the driver IC2 and the display device DSP is connected.

Note that the IC chip 2 may be mounted in the mounting region MA. The IC chip 2 has a built-in display driver DD that outputs signals necessary to display images in a display mode in which images are displayed.

As shown in FIG. 1, in the display region DA, a plurality of pixels PX are formed in a matrix configuration, and the pixels PX have a thin film transistor (TFT) that is a switching device. In the non-display region NDA, a drive circuit that controls and drives scanning lines, picture signal lines, and other components is formed. The drive circuit has a thin film transistor (TFT).

The TFT that is used as the switching device of the pixel PX has to have a small leakage current. Since the TFT that is formed using an oxide semiconductor can make a leakage current small, the TFT is suited as the switching device of the pixel PX. In the following, the oxide semiconductor is referred to as an OS (Semiconductor). The OS includes IGZO (Indium Gallium Zinc Oxide), ITZO (Indium Tin Zinc Oxide), ZnON (Zinc Oxide Nitride), and IGO (Indium Gallium Oxide), for example. In the following, the oxide semiconductor will be described as the OS is represented. Since the carrier of the OS has small mobility, it is sometimes difficult to form a built-in drive circuit in the display device DSP with the TFT using the OS. In the following, the OS is sometimes used in the meaning of the TFT using the OS.

On the other hand, since LTPS (Low Temperature Poly-Si) has high mobility, LTPS is suited as a TFT that constitutes a drive circuit. In the liquid crystal display device, LTPS is often used for polysilicon or polycrystalline silicon (Poly-Si). Thus, in the following, Poly-Si is also referred to as LTPS. Since the TFT formed of LTPS has large mobility, the drive circuit can be formed of a thin film transistor (TFT) using LTPS. In the following, LTPS is sometimes used in the meaning of the TFT using LTPS.

That is, since the thin film transistor (TFT) used for the pixel PX has to have a small leakage current, the use of LTPS is reasonable because the thin film transistor (TFT) using an oxide semiconductor (OS) and used for a drive circuit has to have large mobility.

However, since the thin film transistor may be designed at the mobility of amorphous silicon (a-Si) or the OS depending on products to which the thin film transistor is applied, the configuration of the embodiment of the present invention is also effective in the case where a-Si or the OS is used in the drive circuit.

The display panel PNL according to the present embodiment may be any of a transmissive type having a transmissive display function that displays images by selectively transmitting light incident from the back surface side of the first substrate SUB1, a reflective type having a reflective display function that displays images by selectively reflecting light incident from the front surface side of the second substrate SUB2, or a semi-transmissive type having the transmissive display function and the reflective display function.

The description of the detailed configuration of the display panel PNL is omitted here. However, the display panel PNL may have any configuration corresponding to a display mode using a vertical electric field along the normal of a substrate principal surface, a display mode using a slope electric field inclined in the oblique direction to the substrate principal surface, and a display mode using the appropriate combination of the lateral electric field, the vertical electric field, and the slope electric field. The substrate principal surface here is a plane in parallel with the X-Y plane defined by a first direction X and the second direction Y.

Exemplary Circuit Configuration of Display Device

FIG. 3 is a view showing the basic configuration of the pixel PX and the equivalent circuit of the display device DSP. The plurality of pixels PX are disposed in a matrix configuration in the first direction X and the second direction Y. A plurality of scanning lineage G (G1, G2, . . . ) are connected to a scanning line drive circuit GD. A plurality of signal lines S (S1, S2, . . . ) are connected to a signal line drive circuit SD. A plurality of common electrodes CE (CE1, CE2, . . . ) are connected to a voltage supply unit CD for a common voltage (Vcom), and disposed across the plurality of pixels PX. One pixel PX is connected to one scanning line, one signal line, and one common electrode CE. Note that the scanning line G and the signal line S do not necessarily extend in a straight line, and the scanning line G and the signal line S may partially bend. For example, even though the signal line S partially bends, the signal line S is supposed to extend in the second direction Y. The scanning line drive circuit GD, the signal line drive circuit SD, and the voltage supply unit CD are composed of the thin film transistor (TFT) using LTPS.

Each of the pixels PX includes a switching device SW, a pixel electrode PE, the common electrode CE, the liquid crystal layer LC, and other components. The switching device SW is composed of the thin film transistor (TFT) using an oxide semiconductor (OS), for example, and electrically connected to the scanning line G and the signal line S. The scanning line G is connected to the switching device SW in the individual pixels PX arranged in the first direction X. The signal line S is connected to the switching device SW in the individual pixels PX arranged in the second direction Y. The pixel electrode PE is electrically connected to the switching device SW. The individual pixel electrodes PE are opposite to the common electrode CE, and drives the liquid crystal layer LC with an electric field generated across the pixel electrode PE and the common electrode CE. A retention capacitance CS is formed between the electrode at a potential equal to the common electrode CE and the electrode at a potential equal to the pixel electrode PE, for example.

Exemplary Configuration of Semiconductor Device

Figure 4:
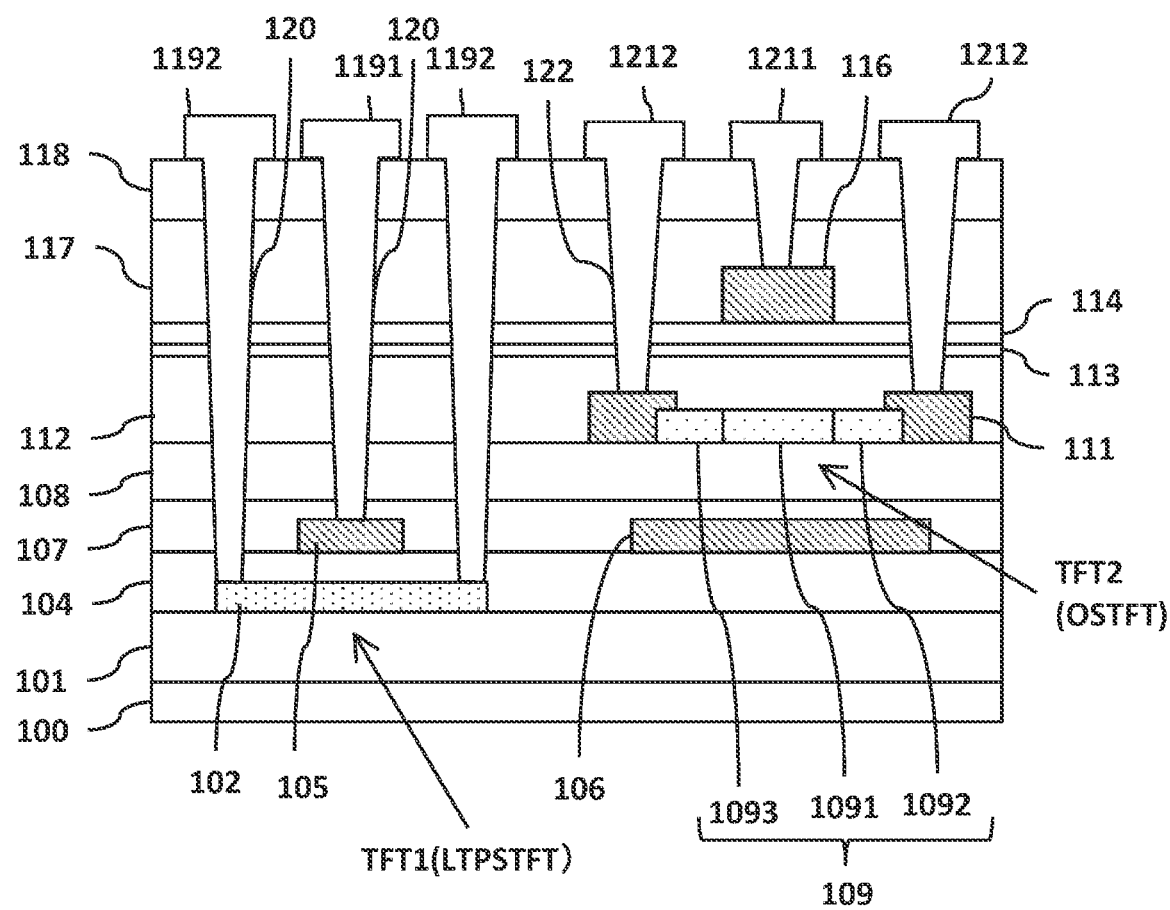
FIG. 4 is a cross sectional view showing an exemplary configuration of the semiconductor device according to the embodiment.

FIG. 4 is a cross sectional view showing an exemplary configuration of the semiconductor device according to the embodiment. A semiconductor device 10 shown in FIG. 4 is the first substrate including pluralities of thin film transistors TFT1 and TFT2. In FIG. 4, the thin film transistor (first thin film the transistor) TFT1 on the left side is a thin film transistor using LTPS (also referred to as an LTPTFT), and the thin film transistor (second thin film the transistor) TFT2 on the right side is a thin film transistor using an oxide semiconductor (OS) (also referred to as an OSTFT). The semiconductor device 10 is a semiconductor device that is built in the display panel.

The semiconductor device 10 includes a substrate 100, a base film 101, a first semiconductor layer 102, a first gate insulating film 104, a first gate electrode 105, a light-shielding film 106, a first insulating film 107, a second insulating film 108, a second semiconductor layer 109, a second gate insulating film 112, an aluminum oxide film (AlO film) 113, a third insulating film 114, a second gate electrode 116, a fourth insulating film 117, a fifth insulating film 118, and other components. Note that the AlO film 113 is an example, not limited to this. The AlO film may be changed to an oxygen-rich oxide semiconductor film. As described later, the AlO film 113 is a film that is used for supplying oxygen to a channel region 1091 in the second semiconductor layer 109. That is, the ALO film 113 only has to be a component (film or layer) that can supply oxygen to the channel region of the oxide semiconductor, and thus an AlO film or an oxygen-rich oxide semiconductor film can be used. In the following, the description is made using the AlO film as a representative example. The third insulating film 114 is provided on the AlO film 113. As described later, in the case where a crack or a hole is present in the AlO film 113 due to a foreign substance, for example, the third insulating film 114 serves a function as a lid that covers a crack or a hole in the AlO film 113. Since the third insulating film 114 prevents oxygen from being emitted from a crack or a hole in the AlO film 113, the third insulating film 114 surely supplies oxygen from the AlO film 113 to the channel region 1091 in the second semiconductor layer 109, and thus can suppress poor oxidation in the channel region 1091 in the second semiconductor layer 109.

In FIG. 4, on the substrate 100 that is formed of glass or a resin, the base film 101 is formed. The base film 101 blocks impurities from glass, for example, and is typically formed of an insulating film, such as silicon oxide SiO or silicon nitride SiN by CVD. Note that in the present specification, the notation "AB" (e.g. SiO), for example, expresses a compound having constituent elements A and B, but the notation does not mean that the composition ratio of the constituent elements A and B is one to one.

On the base film 101, the first semiconductor layer 102 for the LTPSTFT is formed. The first semiconductor layer 102 is formed of LTPS. The first gate insulating film 104 is formed covering the first semiconductor layer 102. The first semiconductor layer 102 can be formed in such a manner, for example, that after amorphous silicon (a-Si) is formed, annealing for dehydrogenation is performed, excimer laser is then applied to convert a-Si into polycrystalline silicon (Poly-Si), and then Poly-Si is patterned. The first gate insulating film 104 can be formed using SiO having TEOS (Tetraethyl orthosilicate) as a raw material.

On the first gate insulating film 104, the first gate electrode 105 and the light-shielding film 106 are formed. The first gate electrode 105 and the light-shielding film 106 are formed of a film stack, such as Ti—Al alloy-Ti or a MoW alloy. The light-shielding film 106 is a film that shield light so as not to apply light incident from the backlight 202 to the channel region 1091 of the OSTFT.

The first insulating film 107 is formed covering the first gate electrode 105, the light-shielding film 106, and the first gate insulating film 104. The first insulating film 107 is formed of SiN by CVD. On the first insulating film 107, the second insulating film 108 is formed. The second insulating film 108 is formed of SiO by CVD.

On the second insulating film 108, the second semiconductor layer 109 for the OSTFT is formed. The second semiconductor layer 109 is formed of the OS. The second semiconductor layer 109 has a film thickness of approximately 10 to 100 nm, and more preferably a film thickness of approximately 50 nm, for example. The second semiconductor layer 109 includes the channel region 1091, a drain region 1092, and a source region 1093. The channel region 1091 is provided between the drain region 1092 and the source region 1093. Therefore, the thin film transistor TFT2 is located above the thin film transistor TFT1 when viewed from the substrate 100.

At the end portion of one end and the end portion of the other end of the second semiconductor layer 109, the metal layer 111 for protection is provided. That is, the metal layer 111 is connected to the end portion of the drain region 1092 that is not in contact with the channel region 1091 and the end portion of the source region 1093 that is not in contact with the channel region 1091. The metal layer 111 is formed of titanium (Ti), for example.

The second gate insulating film 112 is formed covering the second insulating film 108, the second semiconductor layer 109, and the metal layer 111. The second gate insulating film 112 can be formed of SiO by CVD SiH4 (silane) and N2O (dinitrogen monoxide). As an example, the second gate insulating film 112 has a film thickness of approximately 100 to 300 nm, and more preferably a film thickness of approximately 100 nm, and is preferably formed at a relatively high temperature like 350° C.

On the second gate insulating film 112, the aluminum oxide film (in the following, which is noted by AlO) 113 is formed. As an example, the AlO film 113 has a film thickness of approximately 10 to 50 nm, and more preferably a film thickness of approximately 10 nm. On the AlO film 113, the third insulating film 114 is formed. The third insulating film 114 can be formed of SiO by CVD. As an example, the third insulating film 114 has a film thickness of approximately 40 to 80 nm, and more preferably a film thickness of approximately 40 nm, and is preferably formed at a relatively high temperature like 250° C. in comparison with the second gate insulating film 112. The third insulating film 114 is preferably a film having a property that emits oxygen (O) at 250° C. or more. Therefore, it can be said that the second gate insulating film 112 is a high temperature SiO, and it can be said that the third insulating film 114 is a low temperature SiO film in comparison with the second gate insulating film 112. It can also be said that the third insulating film 114 is a film including many defects in comparison with the second gate insulating film 112.

The AlO film 113 serves a function to supply oxygen to the channel region 1091 in the second semiconductor layer 109. The third insulating film 114 serves a function as a lid that covers a crack or a hole in the AlO film 113 even though the AlO film 113 has a crack or a hole due to foreign substances. Thus, the third insulating film 114 surely supplies oxygen from the AlO film 113 or the second gate insulating film 112 to the channel region 1091 in the second semiconductor layer 109, and suppresses poor oxidation in the channel region 1091 in the second semiconductor layer 109.

On the third insulating film 114 corresponding to the position above the channel region 1091 in the second semiconductor layer 109, the second gate electrode 116 is formed. The second gate electrode 116 is formed of a film stack, such as Ti—Al alloy-Ti or a MoW alloy, for example. Therefore, between the second gate electrode 116 and the channel region 1091 in the second semiconductor layer 109, the insulating films, the second gate insulating film 112, the AlO film 113, and the third insulating film 114, in three layers are formed in a stack in the order from below.

The fourth insulating film 117 is formed covering the second gate electrode 116 and the third insulating film 114. The fourth insulating film 117 is formed of SiN. On the fourth insulating film 117, the fifth insulating film 118 is formed. The fifth insulating film 118 is formed of SiO.

After that, a contact hole 120 is formed for forming a gate electrode wire 1191 and a source-drain electrode wire 1192 in the LTPSTFT, and a contact hole 122 is formed for forming a gate electrode wire 1211 and a source-drain electrode wire 1212 in the OSTFT. The contact holes 120 and 122 are formed by dry etching using a CF-based gas (e.g. CF4), or CHF-based gas (e.g. CHF3), for example. On the LTPSTFT side, the contact hole 120 is formed in the insulating films in seven layers and the insulating films in eight layers, and on the OSTFT side, the contact hole 122 is formed in the insulating films in two layers and in the insulating films in five layers. After that, the contact holes 120 and 122 are cleaned using a cleaning fluid of an HF-based gas, and after cleaning, the gate electrode wire 1191, the source-drain electrode wire 1192, the gate electrode wire 1211, and the source-drain electrode wire 1212 are formed. Note that in the present specification, the source-drain electrode wire (1192, 1212) is the source-drain electrode wire (1192, 1212) together with the source electrode wire and the drain electrode wire. The gate electrode wires 1191 and 1211 and the source-drain electrode wires 1192 and 1212 can be formed of a film stack in a stack of Ti, an Al alloy, Ti, for example.

As shown in FIG. 4, on the LTPSTFT side, the contact hole 120 is formed in the insulating films in seven layers (118, 117, 114, 113, 112, 108, and 107) and the insulating films in eight layers (118, 117, 114, 113, 112, 108, 107, and 104), whereas on the OSTFT side, the contact hole 122 is formed in the insulating films in two layers (118 and 117) and in the insulating films in five layers (118, 117, 114, 113, and 112). Therefore, the etching conditions for forming the contact holes have to be adjusted to the conditions on the LTPSTET side. That is, although the OSTFT side is exposed to an etching gas and a cleaning fluid longer, the provision of the metal layer 111 for protection prevents the elimination of the second semiconductor layer 109, and thus the OSTFT can be formed stably.

As described above, the third insulating film 114 is provided, and thus sufficient oxygen is supplied from the AlO film 113 or the second gate insulating film 112 to the channel region 1091 in the second semiconductor layer 109, and the resistance is increased. Therefore, the OSTFT of excellent transistor properties can be achieved.

The semiconductor device, such as a display device, using the OSTFT of excellent transistor properties can be achieved. Thus, the display failure of the display device can be reduced, and the yields of the display device can be improved.

Detailed Description of Third Insulating Film 114

FIG. 5 is a cross sectional view showing the main components of the semiconductor device according to a comparative example. FIG. 6 is a cross sectional view showing the main components of the semiconductor device having the third insulating film 114.

FIG. 5 is an enlarged cross-sectional view showing a portion in which the thin film transistor TFT2 is formed in the case where three foreign substances (FM1 to FM3) are generated in the cause of manufacturing processes. As described in FIG. 4, in the portion in which the thin film transistor TFT2 is formed, the light-shielding film 106 formed on the first gate insulating film 104, the first insulating film 107 formed covering the first gate insulating film 104 and the light-shielding film 106, the second insulating film 108 formed on the first insulating film 107, the second semiconductor layer 109 selectively formed on the second insulating film 108, the second gate insulating film 112 formed on the second insulating film 108 and the second semiconductor layer 109, and the AlO film 113 formed on the second gate insulating film 112 are depicted.

The foreign substance FM1 shows a foreign substance and the like attached on the second gate insulating film 112, for example, and the foreign substances FM2 and FM3 show foreign substances and the like attached in forming the first insulating film 107, for example.

In the AlO film 113, sometimes a hole (opening) ho is sometimes generated due to the foreign substance FM1. In the AlO film 113, a crack cr1 is sometimes further generated due to the foreign substances FM2 and FM3. It can be considered that the cause of this crack Cr1 is the shortage of coverage, for example, by the second insulating film 108, the second semiconductor layer 109, and the AlO film 113. In the AlO film 113, a crack cr2 is sometimes further generated due to the foreign substance FM3. It can be considered that the cause of this crack Cr2 is the coverage failure, for example, by the second insulating film 108 and the AlO film 113. In the AlO film 113, a pin hole ph may be further generated.

After the AlO film 113 having the hole ho, the cracks cr1 and cr2, and the pin hole ph, for example, as described above is formed, the second gate electrode 116 (not shown) is selectively formed on the AlO film 113 corresponding to above the second semiconductor layer 109 to perform annealing for oxidation of the channel region 1091 in the second semiconductor layer 109.

In forming the AlO film 113, oxygen O injected to the second gate insulating film 112 is diffused to the channel region 1091 in the second semiconductor layer 109. However, in the case where the cracks cr1 and cr2 or the hole ho is generated in the AlO film 113 or the pin hole ph is present in the AlO film 113 due to the foreign substances FM1 to FM3, the oxygen O included in the AlO film 113 or the second gate insulating film 112 is sometimes emitted from the cracks cr1 and cr2, the hole ho, or the pin hole ph. In this case, a problem arises that sufficient oxidation of the channel region 1091 in the second semiconductor layer 109 fails. It can be considered that the film thickness of the AlO film 113 is increased so as not to generate the cracks cr1 and cr2, the hole ho, or the pin hole ph. However, since the AlO film 113 itself has many defects, the limitation is imposed on the suppression of the generation of the cracks cr1 and cr2, the hole ho, or the pin hole ph by increasing the film thickness of the AlO film 113.

FIG. 6 is an enlarged cross-sectional view showing a portion in which the thin film transistor TFT2 is formed in the case where the third insulating film 114 is provided on the AlO film 113. Similarly to the description in FIG. 5, the AlO film 113 has a hole ho, cracks cr1 and cr2, and a pin hole ph, for example. However, the hole ho, the cracks cr1 and cr2, and the pin hole ph, for example, are covered by the third insulating film 114. Therefore, even though annealing is performed, the hole ho, the cracks cr1 and cr2, and the pin hole ph in the AlO film 113 are covered by the third insulating film 114, and thus the oxygen O injected to the second gate insulating film 112 can be diffused to the channel region 1091 in the second semiconductor layer 109 in forming the AlO film 113. Consequently, sufficient oxygen is supplied from the AlO film 113 or the second gate insulating film 112 to the channel region 1091 in the second semiconductor layer 109, and the resistance is increased. Accordingly, the OSTFT of excellent transistor properties can be achieved.

The third insulating film 114 is preferably made of SiO formed at a low temperature like 250° C. When the third insulating film 114 is made of SiO formed at a low temperature like 250° C., the third insulating film 114 itself emits oxygen O, when annealing at 250° C. or more. The oxygen O emitted from the third insulating film 114 itself moves from the hole ho, the cracks cr1 and cr2, and the pin hole ph in the AlO film 113 to the second gate insulating film 112 side, and thus poor oxidation in the channel region 1091 in the second semiconductor layer 109 can be suppressed.

The film forming temperature and the film thickness of the second gate insulating film 112, the film thickness of the AlO film 113, and the film forming temperature and the film thickness of the third insulating film 114 are described above. Note that as an example, the total film thickness of the film thickness of the AlO film 113 and the film thickness of the third insulating film 114 is preferably approximately 50 nm. When the total film thickness of the film thickness of the AlO film 113 and the film thickness of the third insulating film 114 is a film thickness of approximately 50 nm or more, attention is necessary because it may be considered that this thickness sometimes affects the initial properties of the thin film transistor TFT2.

Method of Manufacturing the Semiconductor Device 10

Next, referring to FIGS. 7 to 19, a manufacturing method that achieves the semiconductor device including 10 including the thin film transistors TFT1 and TFT2 described in FIG. 4 will be described.

FIG. 7 is a cross sectional view showing a state where the first gate electrode 105 and the light-shielding film 106 are formed. The base film 101 is formed on the substrate 100 having the insulating properties, and the first semiconductor layer 102 is selectively formed on the base film 101. The first gate insulating film 104 is then formed covering the first semiconductor layer 102. After that, on the first gate insulating film 104, the first gate electrode 105 and the light-shielding film 106 are formed. After the first gate electrode 105 is formed, the first semiconductor layer 102 is doped with B (boron) or P (phosphorus) by ion implantation using the first gate electrode 105 as a mask. Thus, to the first semiconductor layer 102 except the positions covered by the first gate electrode 105, the P-type or the N-type electrical conductivity is imparted, and the drain region and the source region are formed in the semiconductor layer 102.

FIG. 8 is a cross sectional view showing a state where the first insulating film 107 is formed. The first insulating film 107 is formed covering the first gate electrode 105, the light-shielding film 106, and the first gate insulating film 104.

The first insulating film 107 is formed of SiN by CVD.

FIG. 9 is a cross sectional view showing a state where the second semiconductor layer 109 is formed. The second insulating film 108 is formed on the first insulating film 107, and the second semiconductor layer 109 is selectively formed on the second insulating film 108. The second insulating film 108 is formed of SiO by CVD. The second semiconductor layer 109 is formed of the OS. The film thickness of the second semiconductor layer 109 is approximately 50 nm, for example.

Figure 10:
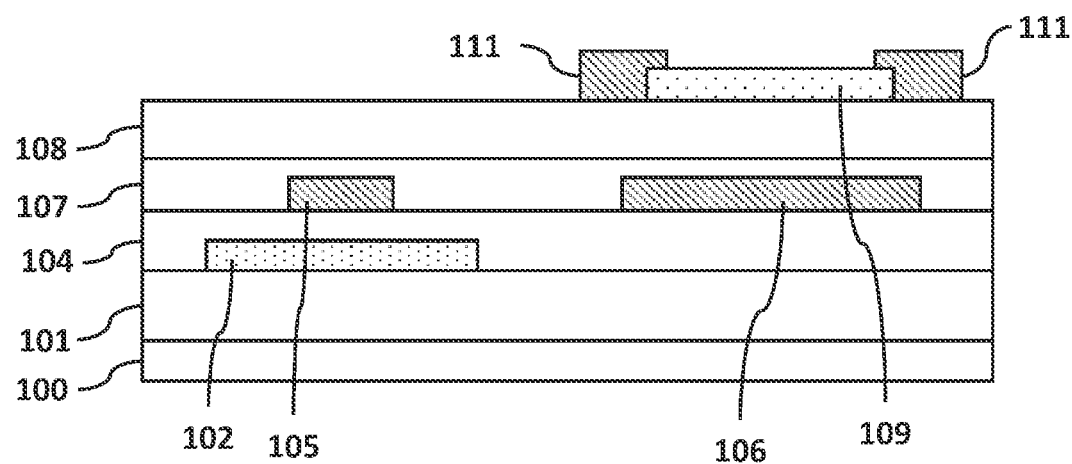
FIG. 10 is a cross sectional view showing a state where a protection metal layer is formed.

FIG. 10 is a cross sectional view showing a state where the metal layer 111 for protection is formed. The metal layer 111 for protection is selectively formed at both ends of the second semiconductor layer 109. The metal layer 111 is formed of Ti, for example. As described in FIG. 4, the metal layer 111 is a protective film that prevents the elimination of the second semiconductor layer 109 due to an etching gas and a cleaning fluid in forming the contact hole (120, 122).

Figure 11:
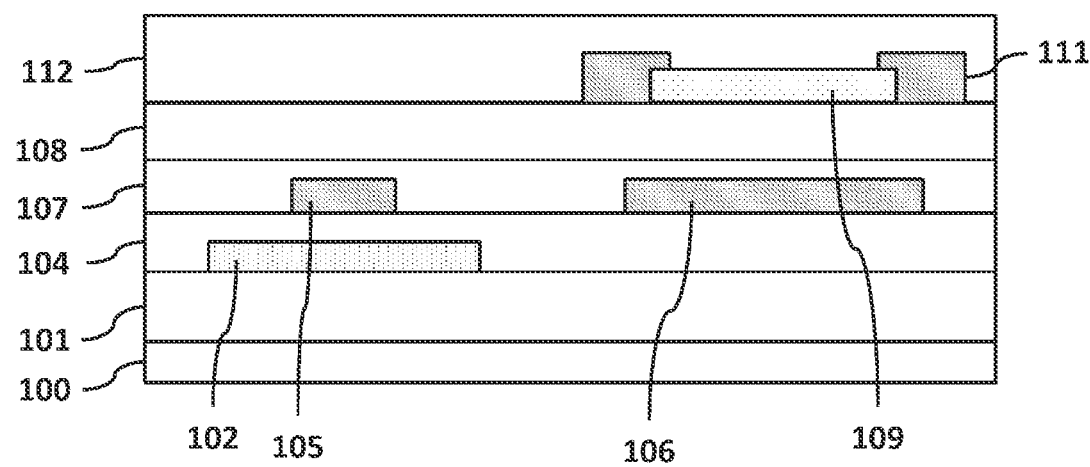
FIG. 11 is a cross sectional view showing a state where a second gate insulating film is formed.

FIG. 11 is a cross sectional view showing a state where the second gate insulating film 112 is formed. The second gate insulating film 112 is formed covering the second insulating film 108, the second semiconductor layer 109, and the metal layer 111. The second gate insulating film 112 can be formed of SiO by CVD using SiH4 (silane) and N2O (dinitrogen monoxide). The film thickness of the second gate insulating film 112 is approximately 100 nm, for example. The film forming temperature of the second gate insulating film 112 is approximately 350° C., for example.

Figure 12:
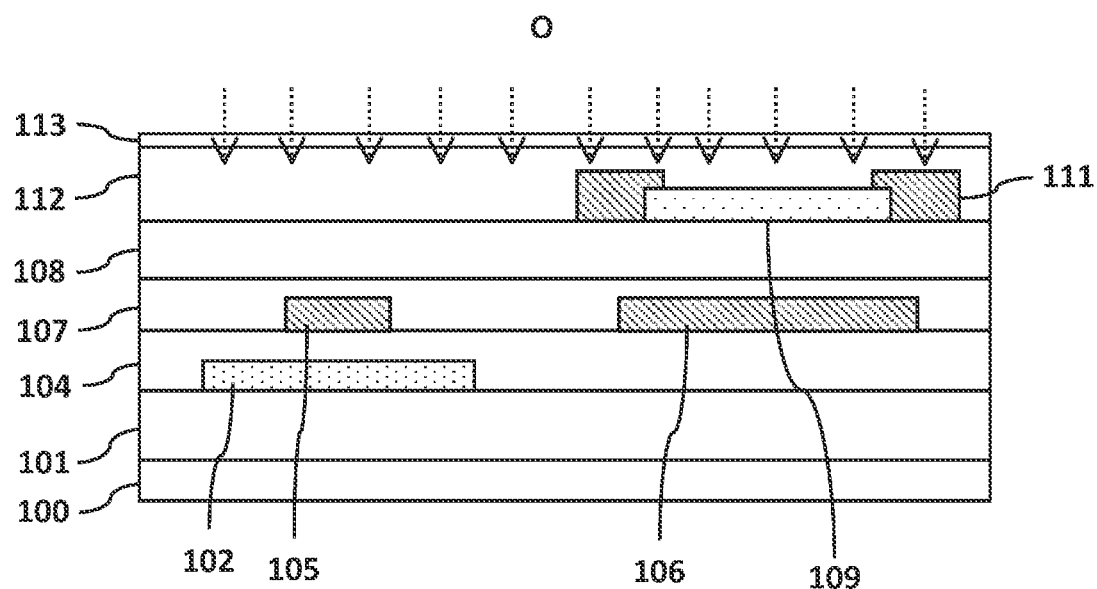
FIG. 12 is a cross sectional view showing a state where an AlO film is formed.

FIG. 12 is a cross sectional view showing a state where the AlO film 113 is formed. The AlO film 113 is formed on the second gate insulating film 112. The AlO film 113 is formed by reactive sputtering. The film thickness of the AlO film 113 is approximately 10 nm, for example. The AlO film 113 formed by reactive sputtering includes a large quantity of oxygen (O). The oxygen (O) is injected into the second gate insulating film 112.

Figure 13:
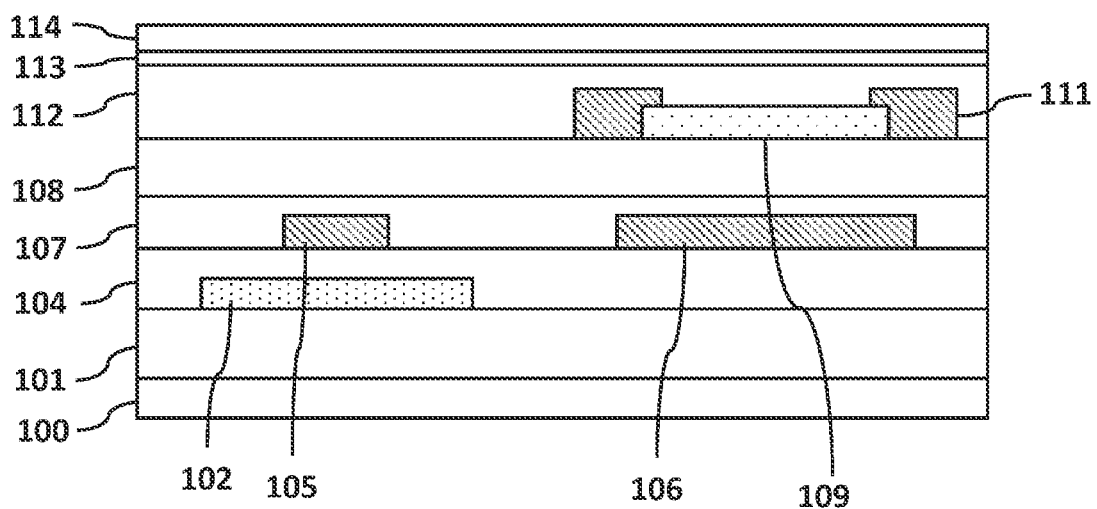
FIG. 13 is a cross sectional view showing a state where the third insulating film is formed.

FIG. 13 is a cross sectional view showing a state where the third insulating film 114 is formed. The third insulating film 114 is formed on the AlO film 113. The third insulating film 114 is formed of SiO by CVD. The film thickness of the third insulating film 114 is approximately 40 nm, for example. The film forming temperature of the third insulating film 114 is approximately 250° C., for example. The third insulating film 114 serves a function as a lid that covers a crack or a hole in the AlO film 113. Therefore, a hole, a crack, a pin hole, and the like formed in the AlO film 113 due to foreign substances, for example, are to be covered by the third insulating film 114.

After the third insulating film 114 is formed, the annealing process is performed. By the annealing process, oxygen is supplied from the AlO film 113 or the second gate insulating film 112 to the second semiconductor layer 109 for oxidation. The temperature of the annealing process is approximately 350° C., for example. Thus, the channel region 1091 in the second semiconductor layer 109 is highly resistant. The temperature of the annealing process is suited to 250° C. or more. Thus, in the case where a hole, a crack, a pin hole, and the like formed in the AlO film 113 due to foreign substances, for example, are present, oxygen emitted from the third insulating film 114 moves to the second gate insulating film 112 side through the hole, the crack, and the pin hole in the AlO film 113, and thus poor oxidation in the channel region 1091 in the second semiconductor layer 109 can also be suppressed.

Figure 14:
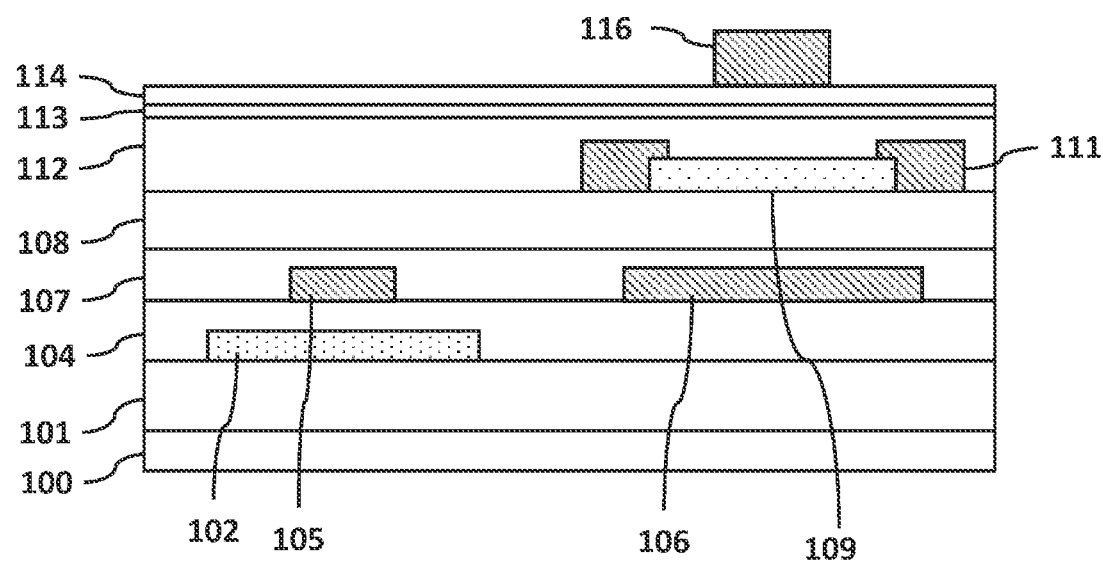
FIG. 14 is a cross sectional view showing a state where a second gate electrode is selectively formed.
Figure 15:
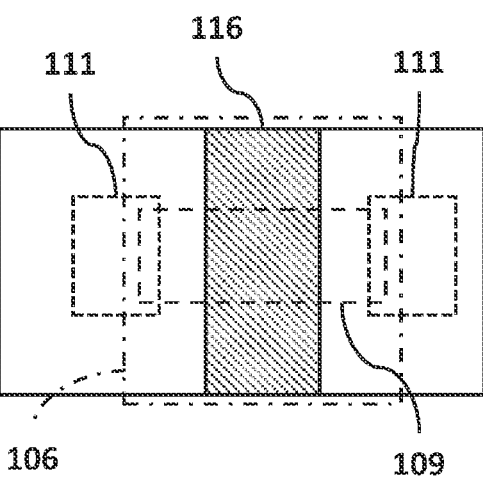
FIG. 15 is a plan view showing the case where a region around the second semiconductor layer in FIG. 14 is viewed from above.

FIG. 14 is a cross sectional view showing a state where the second gate electrode 116 is selectively formed. FIG. 15 is a plan view showing the case where the region around the second semiconductor layer 109 in FIG. 14 is viewed from above.

As shown in FIG. 14, the second gate electrode 116 is selectively formed on the third insulating film 114. As shown in FIG. 4, the second gate electrode 116 is selectively formed on the third insulating film 114 such that the second gate electrode 116 covers the position or the region on the upper side of the channel region 1091 in the second semiconductor layer 109. The second gate electrode 116 is formed of a film stack, such as Ti—Al alloy-Ti or a MoW alloy, for example. Note that the annealing process described above may be performed in this stage.

As shown in FIG. 15, when viewed in a planar view, the second semiconductor layer 109 is provided in an island shape. In the longitudinal direction of the second semiconductor layer 109, the metal layer 111 for protection is provided on both sides of the second semiconductor layer 109. The second gate electrode 116 is selectively provided on the third insulating film 114 such that the second gate electrode 116 extends in the direction crossing the longitudinal direction of the second semiconductor layer 109. On the second semiconductor layer 109, the light-shielding film 106 is provided.

Figure 16:
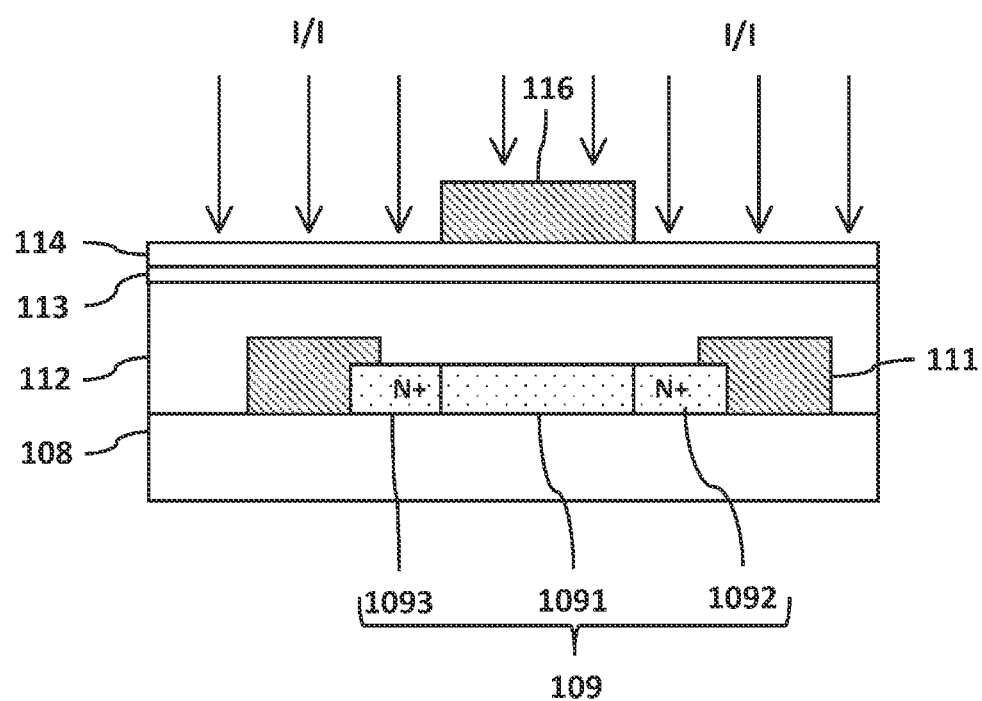
FIG. 16 is an enlarged cross-sectional view showing a region in which a thin film transistor is formed, the view illustrating ion implantation.

FIG. 16 is an enlarged cross-sectional view showing the region in which the thin film transistor TFT2 is formed for describing ion implantation. After selectively forming the second gate electrode 116, as shown in FIG. 16, ion implantation I/I is performed using the second gate electrode 116 as a mask, and electrical conductivity is imparted to the regions in the second semiconductor layer 109 (the regions that are the drain region 1092 and the source region 1093) except the portions covered by the second gate electrode 116. For the ions in the ion implantation I/I, B (boron), P (phosphorus), Ar (argon), and other elements are used. By the ion implantation I/I, the conductive drain region 1092 and the conductive source region 1093 are formed on the second semiconductor layer 109. After that, under a hydrogen atmosphere, an activation process is performed, and the resistances of the drain region 1092 and the source region 1093 are reduced. Therefore, the thin film transistor TFT2 using the oxide semiconductor (OS) of stable properties can be achieved.

Figure 17:
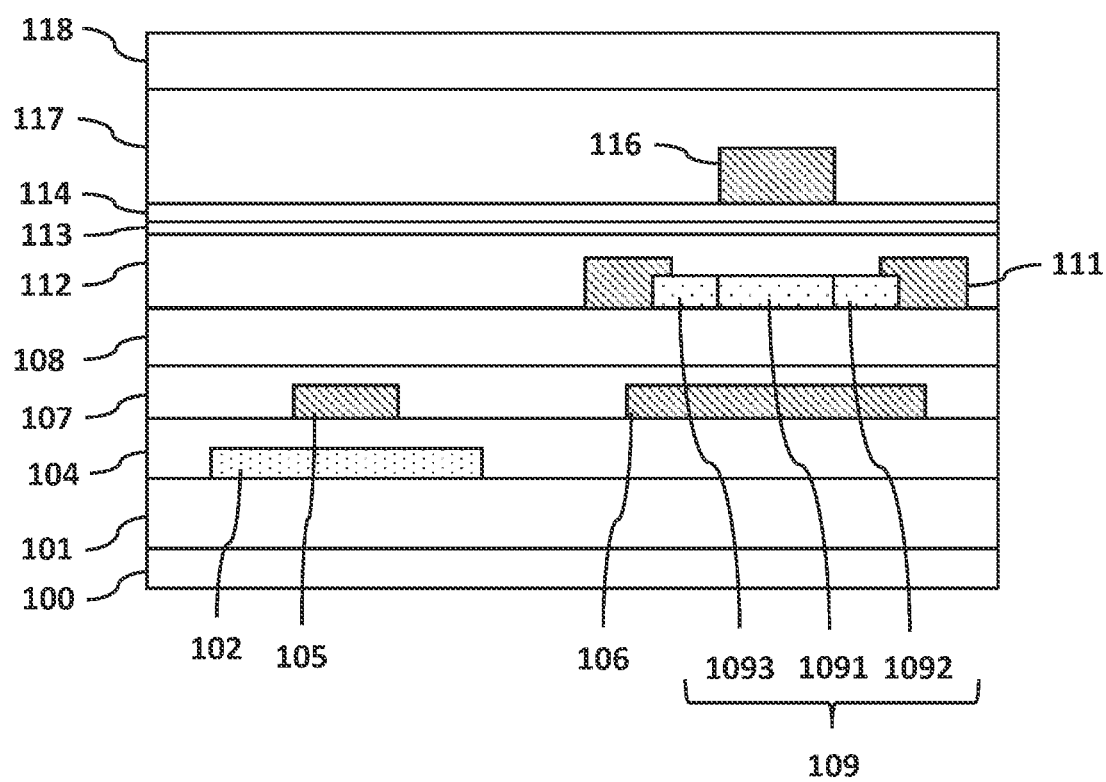
FIG. 17 is a cross sectional view showing a state where a fifth insulating film is formed.

FIG. 17 is a cross sectional view showing a state where the fifth insulating film 118 is formed. The fourth insulating film 117 is formed covering the third insulating film 114 and the second gate electrode 116. Subsequently, the fifth insulating film 118 is formed on the fourth insulating film 117. The fourth insulating film 117 is formed of SiN by CVD. The fifth insulating film 118 is formed of SiO by CVD.

Figure 18:
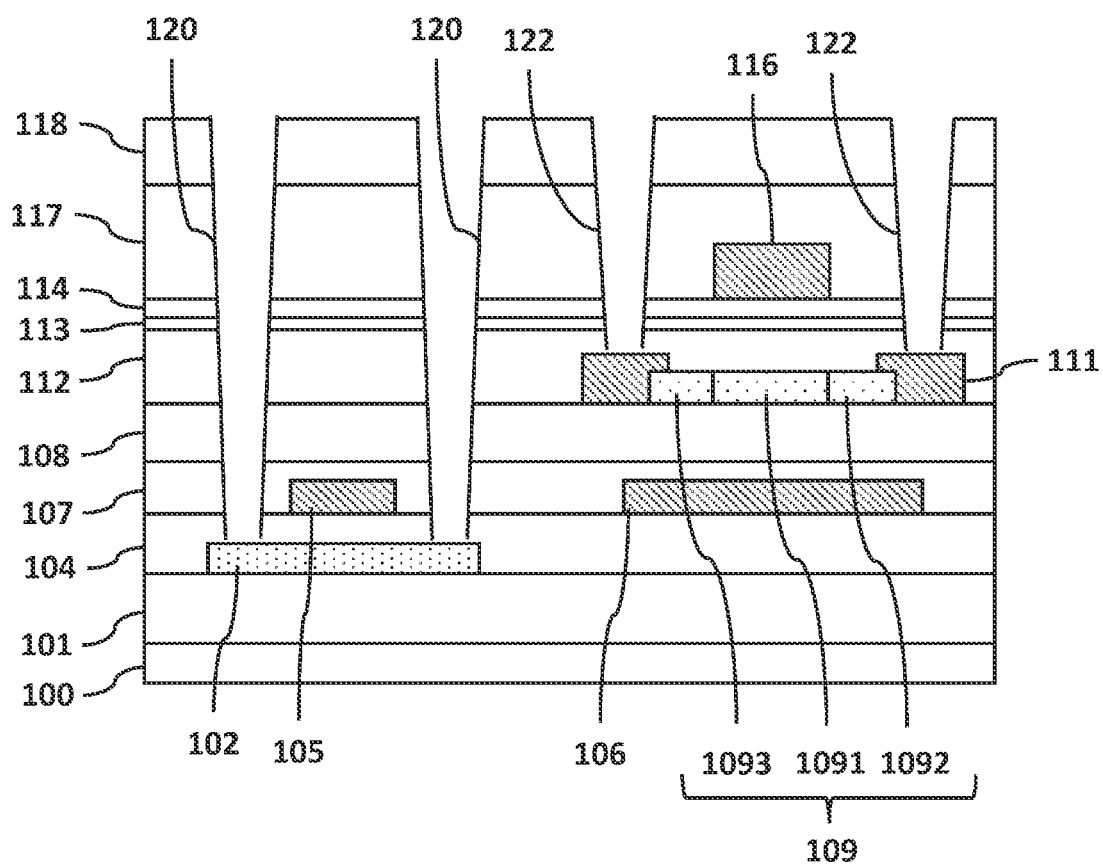
FIG. 18 is a cross sectional view showing a state where contact holes are formed.

FIG. 18 is a cross sectional view showing a state where the contact holes 120 and 122 is formed. The contact holes 120 and 122 are formed by dry etching using a CF-based gas (e.g. CF4), or CHF-based gas (e.g. CHF3), for example. The contact holes 120 and 122 can be simultaneously formed. On the LTPSTFT side, the contact hole 120 is formed in the insulating films in eight layers (118, 117, 114, 113, 112, 108, 107, and 104) such that the upper parts of the drain region and the source region in the first semiconductor layer 102 are exposed. On the OSTFT side, the contact hole 122 is formed in the insulating films in five layers (118, 117, 114, 113, and 112) such that the metal layer 111 is exposed. After that, the contact holes 120 and 122 are cleaned using a cleaning fluid of an HF-based gas.

After cleaning the contact holes 120 and 122, the source-drain electrode wires 1192 and 1212 are selectively formed in the contact holes 120 and 122, and thus the semiconductor device 10 shown in FIG. 4 can be achieved. On the LTPSTFT side, the source-drain electrode wire 1192 is formed in the contact hole 120. On the OSTFT side, the source-drain electrode wire 1212 is formed in the contact hole 122.

According to the embodiment, one or a plurality of effects blow can be obtained.

1) The third insulating film 114 serves a function as a lid that covers a crack or a hole in the AlO film 113 even though the AlO film 113 has a crack or a hole due to foreign substances. Thus, the third insulating film 114 surely supplies oxygen from the AlO film 113 or the second gate insulating film 112 to the channel region 1091 in the second semiconductor layer 109, and can suppress poor oxidation in the channel region 1091 in the second semiconductor layer 109.

2) Since the third insulating film 114 is provided, sufficient oxygen is supplied from the AlO film 113 or the second gate insulating film 112 to the channel region 1091 in the second semiconductor layer 109, and the resistance is increased.

3) According to the effect 2), the OSTFT of excellent transistor properties can be achieved.

4) According to the effect 3), the semiconductor device, such as a display device, using the OSTFT of excellent transistor properties can be achieved.

5) According to the effect 4), the display failure of the display device can be reduced, and the yields of the display device can be improved.

First Exemplary Modification

Figure 19:
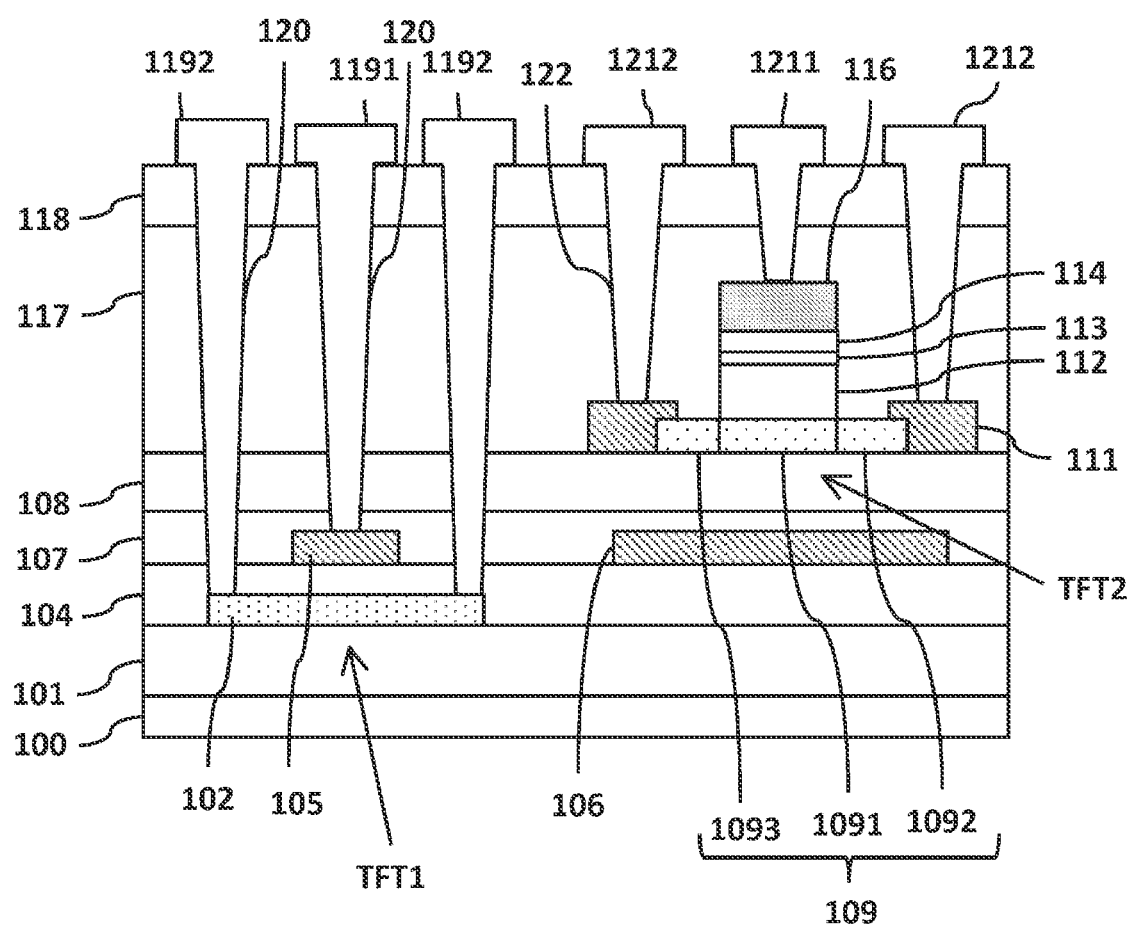
FIG. 19 is a cross sectional view showing an exemplary configuration of a semiconductor device according to a first exemplary modification.

FIG. 19 is a cross sectional view showing an exemplary configuration of a semiconductor device 10a according to a first exemplary modification. The semiconductor device 10a shown in FIG. 19 is different from the semiconductor device 10 shown in FIG. 4 in that in FIG. 19, the second gate insulating film 112, the AlO film 113, and the third insulating film 114 are provided only below the second gate electrode 116. Therefore, as shown in FIG. 19, the fourth insulating film 117 is provided so as to cover the second insulating film 108, the metal layer 111, the second semiconductor layer 109, the second gate insulating film 112, the AlO film 113, the third insulating film 114, and the second gate electrode 116. Similarly to the semiconductor device 10 according to the embodiment, also in the first exemplary modification, between the second gate electrode 116 and the channel region 1091 in the second semiconductor layer 109, the insulating films, namely the second gate insulating film 112, the AlO film 113, and the third insulating film 114, in three layers are formed in a stack in the order from below. The other configurations of the semiconductor device 10a shown in FIG. 19 are the same as the configurations of the semiconductor device 10 shown in FIG. 4, and the description is omitted.

Method of Manufacturing the Semiconductor Device 10a According to the First Exemplary Modification Next, a method of manufacturing the semiconductor device 10a according to the first exemplary modification will be described. In the method of manufacturing the semiconductor device 10a, since the manufacturing step shown in FIG. 7 to FIG. 14 described in the embodiment is the same, the duplicate description is omitted, and the manufacturing step after FIG. 14 will be described with reference to FIGS. 20 to 23.

Figure 20:
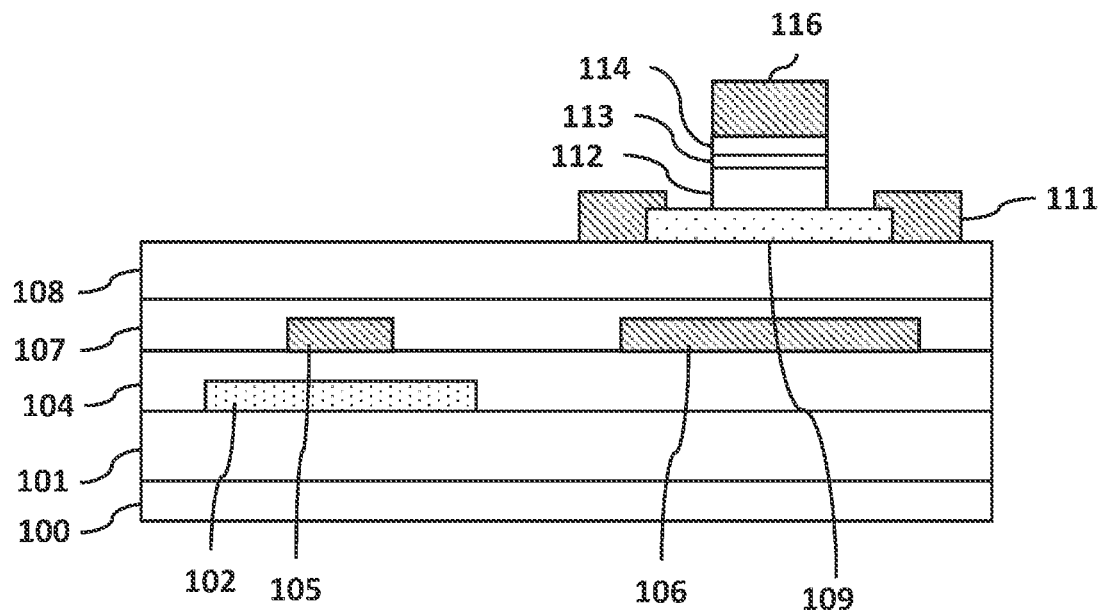
FIG. 20 is a cross sectional view showing a state where the second gate insulating film, the AlO film, and the third insulating film are removed by etching, for example.

FIG. 20 is a cross sectional view showing a state where the second gate insulating film 112, the AlO film 113, and the third insulating film 114 are removed by etching, for example. The second gate insulating film 112, the AlO film 113, and the third insulating film 114 are removed by etching, for example, such that the second gate insulating film 112, the AlO film 113, and the third insulating film 114 are left under the second gate electrode 116. Thus, the second insulating film 108, the metal layer 111, and the second semiconductor layer 109 are partially exposed. The exposed portions of the second semiconductor layer 109 correspond to the portions of the second semiconductor layer 109 that are not covered by the metal layer 111 and the second gate insulating film 112. Note that the annealing process described above may be performed in this stage.

Figure 21:
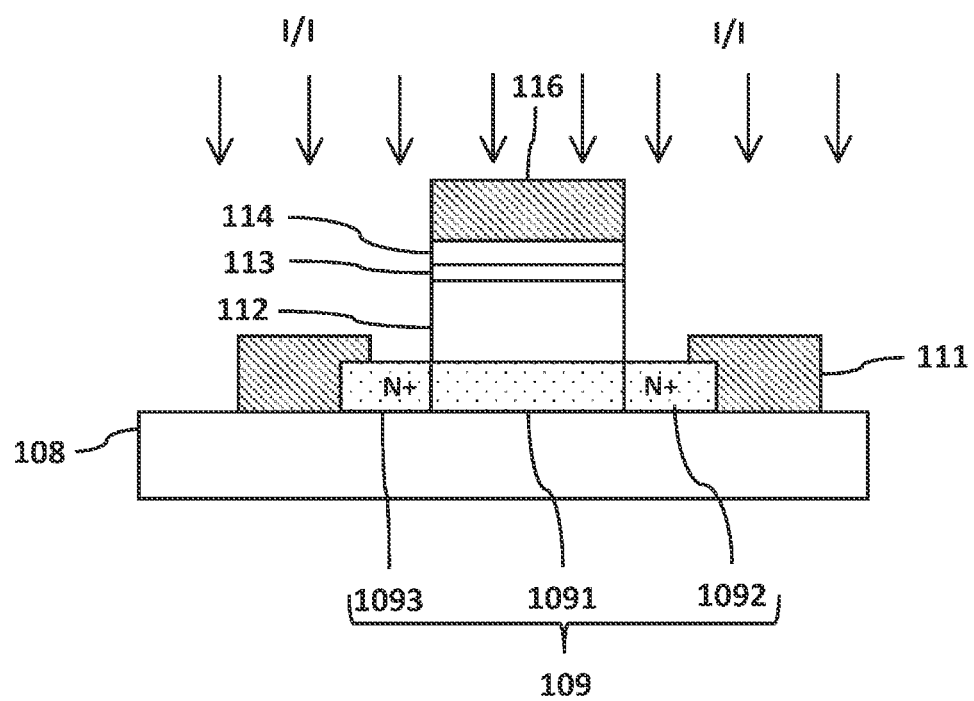
FIG. 21 is an enlarged cross-sectional view showing a region in which the thin film transistor is formed, the view illustrating ion implantation.

FIG. 21 is an enlarged cross-sectional view showing the region in which the thin film transistor TFT2 is formed for describing ion implantation. As shown in FIG. 21, the ion implantation I/I is performed using the second gate electrode 116 as a mask, and electrical conductivity is imparted to the regions in the second semiconductor layer 109 exposed from the second gate insulating film 112 (the regions that are the drain region 1092 and the source region 1093). For the ions in the ion implantation I/I, B (boron), P (phosphorus), Ar (argon), and other elements are used. By the ion implantation I/I, the conductive drain region 1092 and the conductive source region 1093 are formed on the second semiconductor layer 109. After that, under the hydrogen atmosphere, the activation process is performed, and the resistances of the drain region 1092 and the source region 1093 are reduced. Therefore, the thin film transistor TFT2 using the oxide semiconductor (OS) of stable properties can be achieved.

Figure 22:
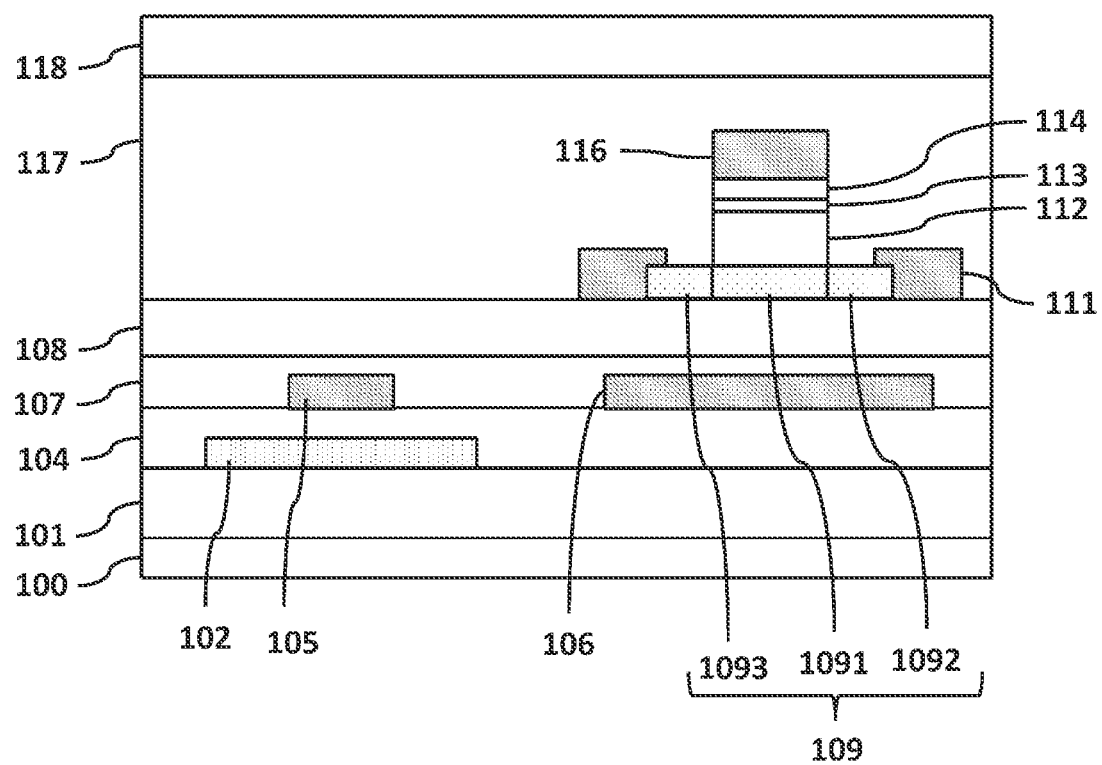
FIG. 22 is a cross sectional view showing a state where the fifth insulating film is formed.

FIG. 22 is a cross sectional view showing a state where the fifth insulating film 118 is formed. The fourth insulating film 117 is formed so as to cover the second insulating film 108, the metal layer 111, the second semiconductor layer 109, the second gate insulating film 112, the AlO film 113, the third insulating film 114, and the second gate electrode 116. Subsequently, the fifth insulating film 118 is formed on the fourth insulating film 117. The fourth insulating film 117 is formed of SiN by CVD. The fifth insulating film 118 is formed of SiO by CVD.

Figure 23:
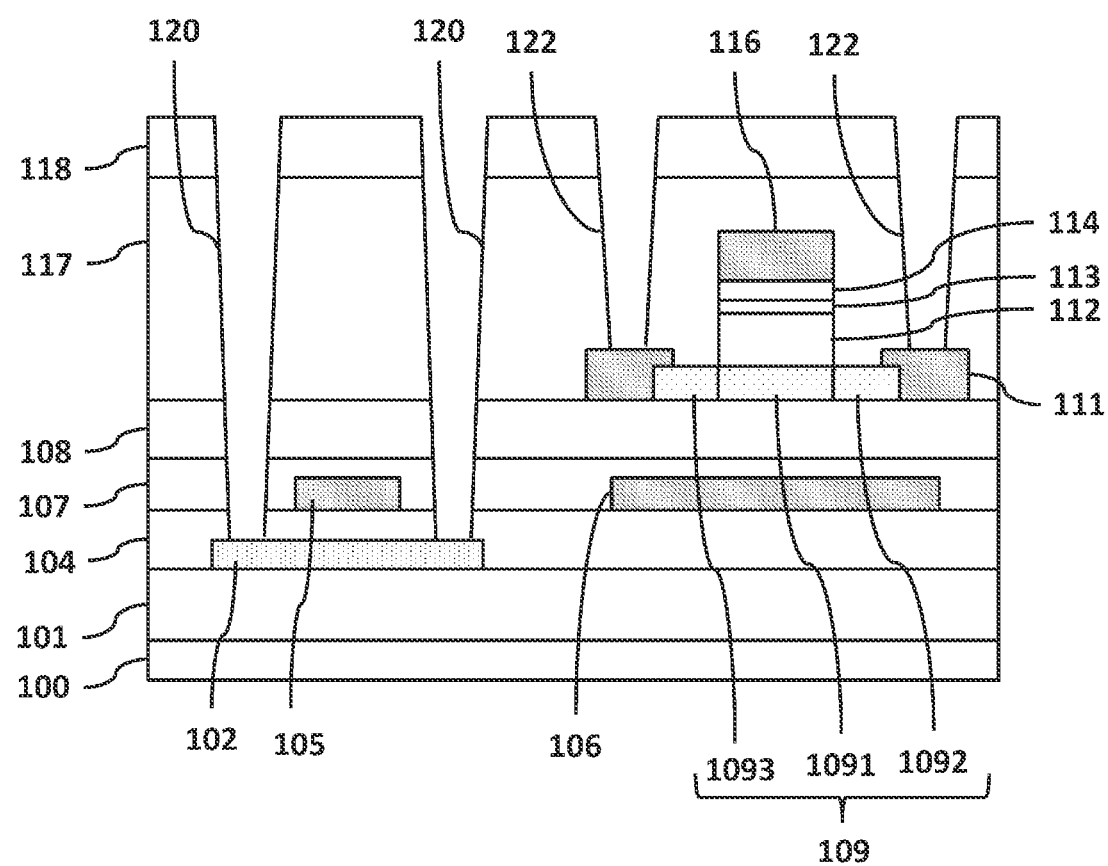
FIG. 23 is a cross sectional view showing a state where the contact holes are formed.

FIG. 23 is a cross sectional view showing a state where the contact holes 120 and 122 is formed. The contact holes 120 and 122 are formed by dry etching using a CF-based gas (e.g. CF4), or CHF-based gas (e.g. CHF3), for example. On the LTPSTFT side, the contact hole 120 is formed such that the upper parts of the drain region and the source region in the first semiconductor layer 102 are exposed. On the OSTFT side, the contact hole 122 is formed such that the metal layer 111 is exposed. After that, the contact holes 120 and 122 are cleaned using a cleaning fluid of an HF-based gas.

After cleaning the contact holes 120 and 122, the source-drain electrode wires 1192 and 1212 are selectively formed in the contact holes 120 and 122, and thus the semiconductor device 10 shown in FIG. 19 can be achieved. On the LTPSTET side, the source-drain electrode wire 1192 is formed in the contact hole 120. On the OSTFT side, the source-drain electrode wire 1212 is formed in the contact hole 122.

According to the first exemplary modification, the effects similar to those of the embodiment can be obtained.

Second Exemplary Modification

In the embodiment and the first exemplary modification, the semiconductor device 10, such as a display device, having the LTPSTET and the OSTFT is described. In the second exemplary modification, a semiconductor device 10b, such as a display device, having only the OSTFT will be described. In this case, in the configuration of the OSTFT shown in FIG. 4, the protection metal layer 111 connected to the drain region 1092 and the source region 1093 can be removed. Therefore, the film forming step and the patterning step of the metal layer 111, and the cleaning step of the contact hole can be removed, and thus the manufacturing step can be shortened.

Figure 24:
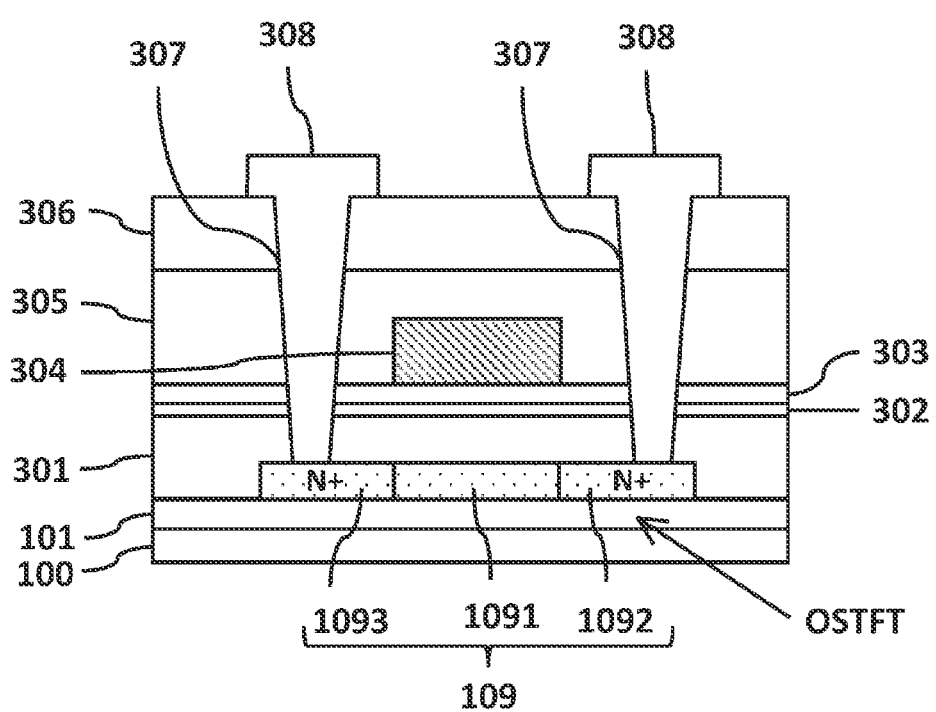
FIG. 24 is a cross sectional view showing an exemplary configuration of a semiconductor device according to a second exemplary modification.

FIG. 24 is a cross sectional view showing an exemplary configuration of the semiconductor device 10b according to the second exemplary modification. The semiconductor device 10b includes the substrate 100, the base film 101, the semiconductor layer 109, the gate insulating film 301, an aluminum oxide film (AlO film) 302, a first insulating film 303, a gate electrode 304, a second insulating film 305, and a third insulating film 306, for example. Note that the AlO film 113 is an example, not limited to this. The AlO film may be changed to an oxygen-rich oxide semiconductor film. As described later, the AlO film 302 is a film that is used for supplying oxygen to the channel region 1091 in the semiconductor layer 109. As described in FIG. 5, the first insulating film 303 serves a function as a lid that covers a crack or a hole generated in the AlO film 302 due to foreign substances, for example. Since the first insulating film 303 prevents oxygen from being emitted from a crack or a hole generated in the AlO film 302, the first insulating film 303 surely supplies oxygen from the AlO film 302 to the channel region 1091 in the semiconductor layer 109, and thus can suppress poor oxidation in the channel region 1091 in the semiconductor layer 109.

In FIG. 24, on the substrate 100 that is formed of glass or a resin, the base film 101 is formed. The base film 101 blocks impurities from glass, for example, and is typically formed of an insulating film, such as silicon oxide SiO or silicon nitride SiN by CVD.

On the base film 101, the semiconductor layer 109 for the OSTFT is formed. The semiconductor layer 109 is formed of the oxide semiconductor film (OS). The semiconductor layer 109 has a film thickness of approximately 10 to 100 nm, and more preferably a film thickness of approximately 50 nm, for example. The semiconductor layer 109 includes the channel region 1091, the drain region 1092, and the source region 1093. The channel region 1091 is provided between the drain region 1092 and the source region 1093.

The gate insulating film 301 is formed covering the base film 101 and the semiconductor layer 109. The gate insulating film 301 can be formed of SiO by CVD SiH4 (silane) and N2O (dinitrogen monoxide). As an example, the gate insulating film 301 has a film thickness of approximately 100 to 300 nm, and more preferably a film thickness of approximately 100 nm, and is preferably formed at a relatively high temperature like 350° C.

On the gate insulating film 301, the aluminum oxide film (in the following, the AlO film) 302 is formed. As an example, the AlO film 302 has a film thickness of approximately 10 to 50 nm, and more preferably a film thickness of approximately 10 nm. On the AlO film 302, the first insulating film 303 is formed. The first insulating film 303 can be formed of SiO by CVD.

As an example, the first insulating film 303 has a film thickness of approximately 40 to 80 nm, and more preferably a film thickness of approximately 40 nm, and is preferably formed at a relatively high temperature like 250° C. in comparison with the gate insulating film 301. The first insulating film 303 is preferably a film having a property that emits oxygen (O) at 250° C. or more. Therefore, it can be said that the gate insulating film 301 is a high temperature SiO, and it can be said that the first insulating film 303 is a low temperature SiO film in comparison with the gate insulating film 301. It may be said that the first insulating film 303 is a film including many defects in comparison with the gate insulating film 301.

On the first insulating film 303 corresponding to the upper part of the channel region 1091 in the semiconductor layer 109, the gate electrode 304 is formed. The gate electrode 304 is formed of a film stack, such as Ti—Al alloy-Ti or a MoW alloy, for example. Therefore, between the gate electrode 304 and the channel region 1091 in the semiconductor layer 109, the insulating films in three layers, the gate insulating film 301, the AlO film 302, and the first insulating film 303, are formed in a stack in the order from below.

The second insulating film 305 is formed covering the gate electrode 304 and the first insulating film 303.

The second insulating film 305 is formed of SiN. On the second insulating film 305, the third insulating film 306 is formed. The third insulating film 306 is formed of SiO.

After that, in order to form a source-drain electrode wire 308 on the OSTFT, a contact hole 307 is formed in the second insulating film 305 and the third insulating film 306 such that the drain region 1092 and the source region 1093 in the semiconductor layer 109 are exposed. The contact hole 307 is formed by dry etching using a CF-based gas (e.g. CF4), or CHF-based gas (e.g. CHF3), for example. After that, the source-drain electrode wire 308 connected to the drain region 1092 and the source region 1093 in the semiconductor layer 109 is formed in the contact hole 307.

As described above, since the first insulating film 303 is provided, sufficient oxygen is supplied from the AlO film 302 or the gate insulating film 302 to the channel region 1091 in the semiconductor layer 109, and the resistance is increased. Therefore, the OSTFT of excellent transistor properties can be achieved. The semiconductor device, such as a display device, using the OSTFT of excellent transistor properties can be achieved. Thus, the display failure of the display device can be reduced, and the yields of the display device can be improved.

Third Exemplary Modification

Figure 25:
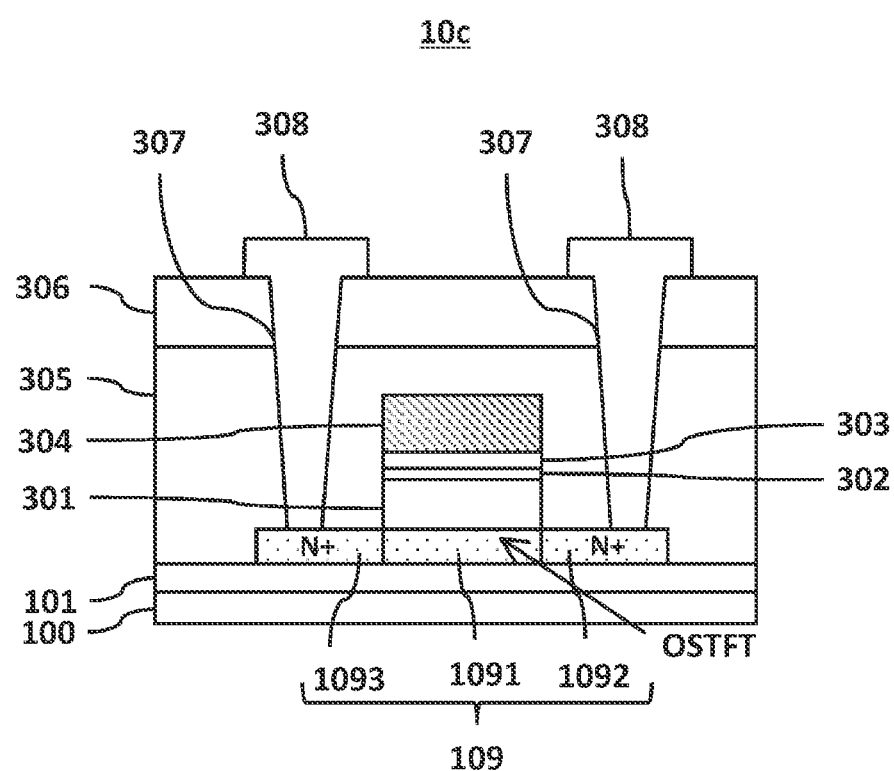
FIG. 25 is a cross sectional view showing an exemplary configuration of a semiconductor device according to a third exemplary modification.

FIG. 25 is a cross sectional view showing an exemplary configuration of a semiconductor device 10c according to a third exemplary modification. The semiconductor device 10c shown in FIG. 25 is different from the semiconductor device 10b shown in FIG. 24 in that in FIG. 25, the gate insulating film 301, the AlO film 302, and the first insulating film 303 are provided only under the gate electrode 304. Therefore, as shown in FIG. 25, the second insulating film 305 is provided so as to cover the base film 101, the semiconductor layer 109, the gate insulating film 301, the AlO film 302, the first insulating film 303, and the gate electrode 304. Similarly to the second exemplary modification, in the third exemplary modification, between the gate electrode 304 and the channel region 1091 in the semiconductor layer 109, the insulating films in three layers, namely the gate insulating film 301, the AlO film 302, and the first insulating film 303, are formed in a stack in the order from below. The other configurations of the semiconductor device 10c shown in FIG. 25 are the same as the configurations of the semiconductor device 10b shown in FIG. 24, and the description is omitted.

Method of Manufacturing the Semiconductor Device 10b according to the Second Exemplary Modification Next, referring to FIGS. 26 to 31, a manufacturing method that achieves the semiconductor device 10b shown in FIG. 24 will be described.

Figure 26:
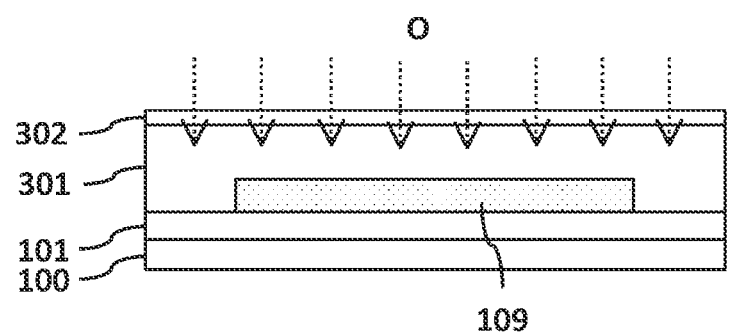
FIG. 26 is a cross sectional view showing a state where the AlO film is formed.

FIG. 26 is a cross sectional view showing a state where the AlO film 302 is formed. The base film 101 is formed on the substrate 100 having the insulating properties, and the semiconductor layer 109 is formed on the base film 101. The gate insulating film 301 is formed covering the base film 101 and the semiconductor layer 109, and the AlO film 302 is formed on the gate insulating film 301. The substrate 100 is formed of glass or a resin. The base film 101 is formed of silicon oxide or silicon nitride, for example, by CVD. The semiconductor layer 109 is formed of the oxide semiconductor (OS). The gate insulating film 301 can be formed of SiO by CVD SiH4 (silane) and N2O (dinitrogen monoxide). The film thickness of the gate insulating film 301 is approximately 100 nm, for example. The film forming temperature of the gate insulating film 301 is approximately 350° C., for example.

Similarly to the description in the embodiment, the AlO film 302 is formed by reactive sputtering. The AlO film 302 formed by reactive sputtering includes a large quantity of oxygen (O). The oxygen (O) is injected into the gate insulating film 301.

Figure 27:
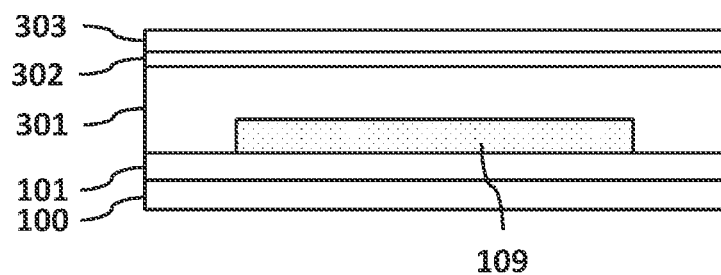
FIG. 27 is a cross sectional view showing a state where the first insulating film is formed.

FIG. 27 is a cross sectional view showing a state where the first insulating film 303 is formed. The first insulating film 303 is formed on the AlO film 302. The first insulating film 303 is formed of SiO by CVD. The film thickness of the first insulating film 303 is approximately 40 nm, for example. The film forming temperature of the first insulating film 303 is approximately 250° C., for example. The first insulating film 303 serves a function as a lid that covers a crack or a hole in the AlO film 302. Therefore, a hole, a crack, a pin hole, and the like formed in the AlO film 113 due to foreign substances, for example, are covered by the first insulating film 303.

After the first insulating film 303 is formed, the annealing process is performed. By the annealing process, oxygen is supplied from the AlO film 302 or the gate insulating film 301 to the semiconductor layer 109 for oxidation. Thus, the resistance of the channel region 1091 in the semiconductor layer 109 is increased.

The temperature of the annealing process is approximately 350° C., for example. The temperature of the annealing process is suited to 250° C. or more.

Thus, in the case where a hole, a crack, a pin hole, and the like formed in the AlO film 302 due to foreign substances, for example, are present, oxygen emitted from the first insulating film 303 moves to the gate insulating film 301 side through the hole, the crack, and the pin hole in the AlO film 302, and thus poor oxidation in the channel region 1091 in the semiconductor layer 109 can also be suppressed.

Figure 28:
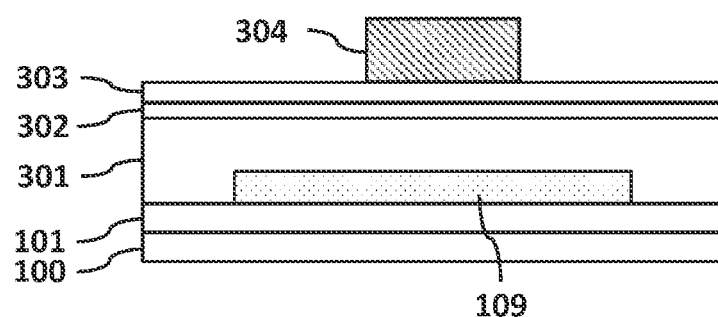
FIG. 28 is a cross sectional view showing a state where the gate electrode is selectively formed.

FIG. 28 is a cross sectional view showing a state where the gate electrode 304 is selectively formed. The gate electrode 304 is selectively formed on the first insulating film 303. As shown in FIG. 24, the gate electrode 304 is selectively formed on the first insulating film 303 so as to cover the position on the upper side of the channel region 1091 in the semiconductor layer 109 or to cover the channel region 1091. The gate electrode 304 is formed of a film stack, such as Ti—Al alloy-Ti or a MoW alloy, for example. Note that the annealing process described above may be performed in this stage.

Figure 29:
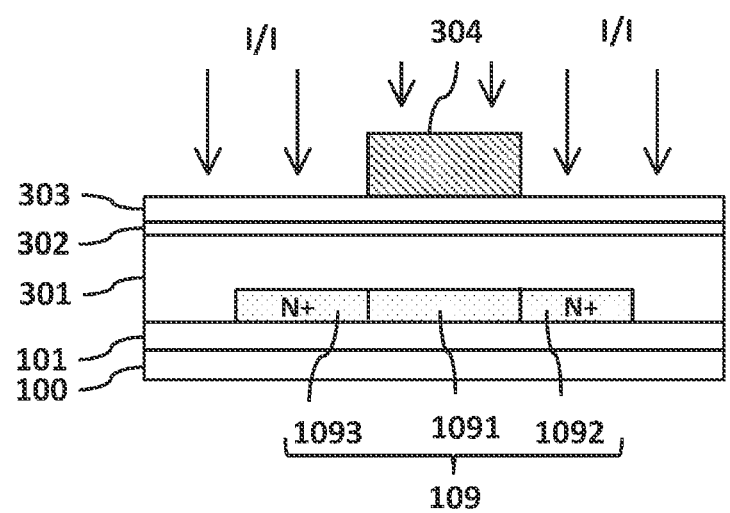
FIG. 29 is a cross sectional view illustrating ion implantation I/I.

FIG. 29 is a cross sectional view illustrating ion implantation I/I. The ion implantation I/I is performed using the gate electrode 304 as a mask, and electrical conductivity is imparted to the regions in the semiconductor layer 109 (the regions that are the drain region 1092 and the source region 1093) except the portions covered by the gate electrode 304. For the ions in the ion implantation I/I, B (boron), P (phosphorus), Ar (argon), and other elements are used. By the ion implantation I/I, the conductive drain region 1092 and the conductive source region 1093 are formed in the semiconductor layer 109. After that, under the hydrogen atmosphere, the activation process is performed, and the resistances of the drain region 1092 and the source region 1093 are decreased (N+). Therefore, the thin film transistor using the oxide semiconductor (OS) of stable properties can be achieved.

Figure 30:
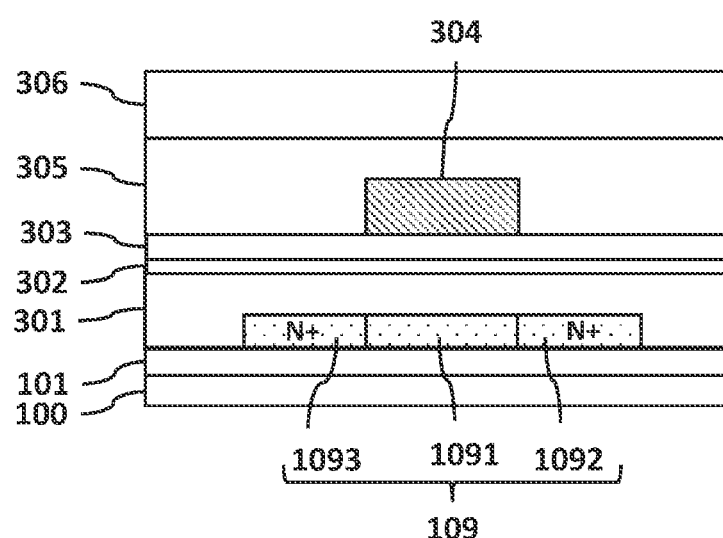
FIG. 30 is a cross sectional view showing a state where the third insulating film is formed.

FIG. 30 is a cross sectional view showing a state where the third insulating film 306 is formed. The second insulating film 305 is formed covering the gate electrode 304 and the first insulating film 303. The second insulating film 305 is formed of SiN. On the second insulating film 305, the third insulating film 306 is formed. The third insulating film 306 is formed of SiO.

Figure 31:
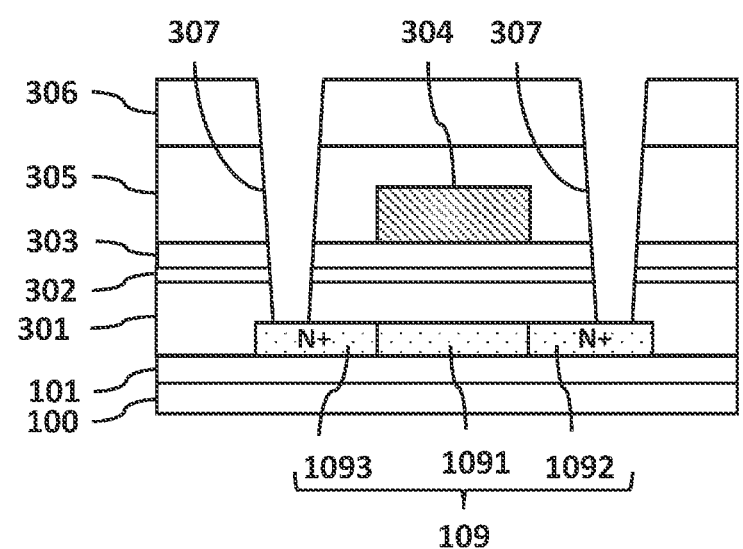
FIG. 31 is a cross sectional view showing a state where contact holes are formed.

FIG. 31 is a cross sectional view showing a state where the contact hole 307 is formed. The contact hole 307 is formed by dry etching using a CF-based gas (e.g. CF4), or CHF-based gas (e.g. CHF3), for example. The contact hole 307 is formed in the insulating films (306, 305, 303, 302, and 301) such that the drain region 1092 and the source region 1093 are exposed.

After that, in the contact hole 307, the source-drain electrode wire 308 is formed. As described above, as shown in FIG. 24, the semiconductor device 10b including the thin film transistor (OSTFT) using the oxide semiconductor (OS) is formed.

Method of Manufacturing the Semiconductor Device 10c According to Third Exemplary Modification Next, a method of manufacturing that achieves the semiconductor device 10c shown in FIG. 25 will be described. In the method of manufacturing the semiconductor device 10c, since the manufacturing step shown in FIGS. 26 to 28 described in the method of manufacturing that achieves the semiconductor device 10b, the duplicate description is omitted, and the manufacturing step after FIG. 28 will be described with reference to FIGS. 32 to 35.

Figure 32:
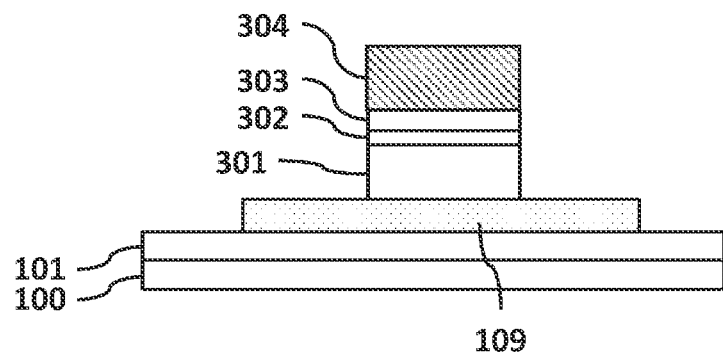
FIG. 32 is a cross sectional view showing a state where the gate insulating film, the AlO film and the first insulating film are removed by etching, for example.

FIG. 32 is a cross sectional view showing a state where the gate insulating film 301, the AlO film 302, and the first insulating film 303 are removed by etching, for example. The gate insulating film 301, the AlO film 302 and the first insulating film 303 are removed by etching, for example, such that the gate insulating film 301, the AlO film 302, and the first insulating film 303 are left under the gate electrode 304. Thus, the base film 101 and the semiconductor layer 109 are partially exposed. The exposed portions of the semiconductor layer 109 correspond to the portions of the semiconductor layer 109 that are not covered by the gate insulating film 301. Note that the annealing process described above may be performed in this stage.

Figure 33:
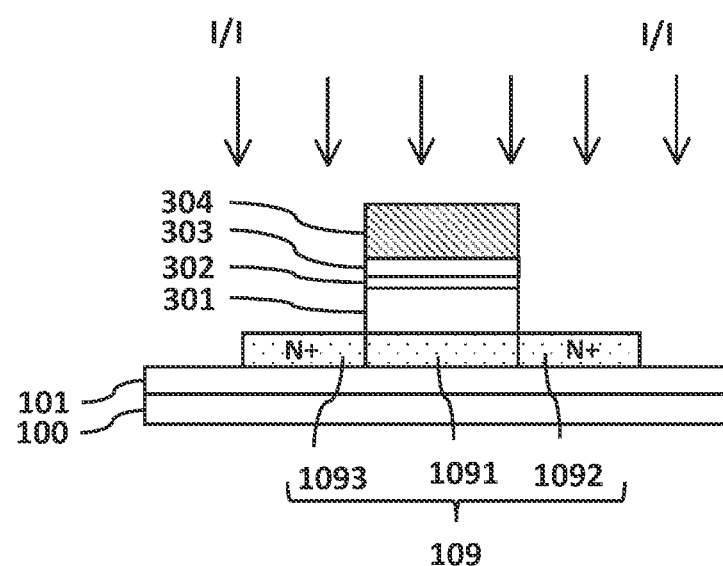
FIG. 33 is a cross sectional view illustrating ion implantation I/I.

FIG. 33 is a cross sectional view illustrating ion implantation I/I. The ion implantation I/I is performed using the gate electrode 304 as a mask, and electrical conductivity is imparted to the regions in the semiconductor layer 109 exposed from the gate insulating film 301 (the regions that are the drain region 1092 and the source region 1093). For the ions in the ion implantation I/I, B (boron), P (phosphorus), Ar (argon), and other elements are used. By the ion implantation I/I, the conductive drain region 1092 and the conductive source region 1093 are formed in the semiconductor layer 109. After that, under the hydrogen atmosphere, the activation process is performed, and the resistances of the drain region 1092 and the source region 1093 are reduced. Therefore, the thin film transistor using the oxide semiconductor (OS) of stable properties the OSTFT can be achieved.

Figure 34:
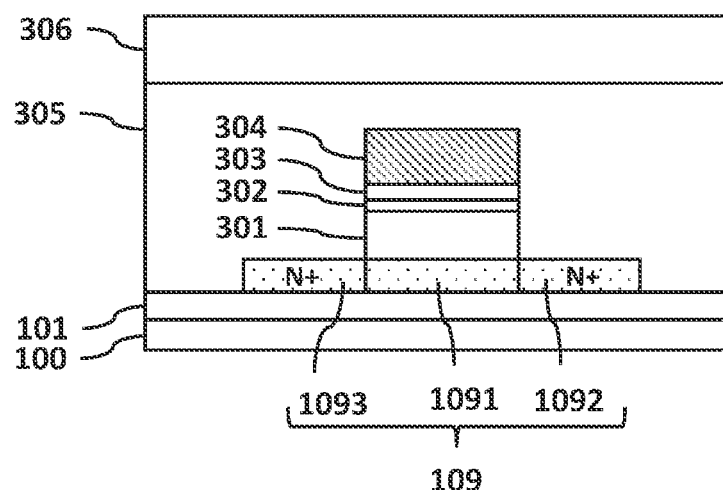
FIG. 34 is a cross sectional view showing a state where the third insulating film is formed.

FIG. 34 is a cross sectional view showing a state where the third insulating film 306 is formed. The second insulating film 305 is formed so as to cover the base film 101, the semiconductor layer 109, the gate insulating film 301, the AlO film 302, the first insulating film 303, and the gate electrode 304. Subsequently, on the second insulating film 305, the third insulating film 306 is formed. The second insulating film 305 is formed of SiN by CVD. The third insulating film 306 is formed of SiO by CVD.

Figure 35:
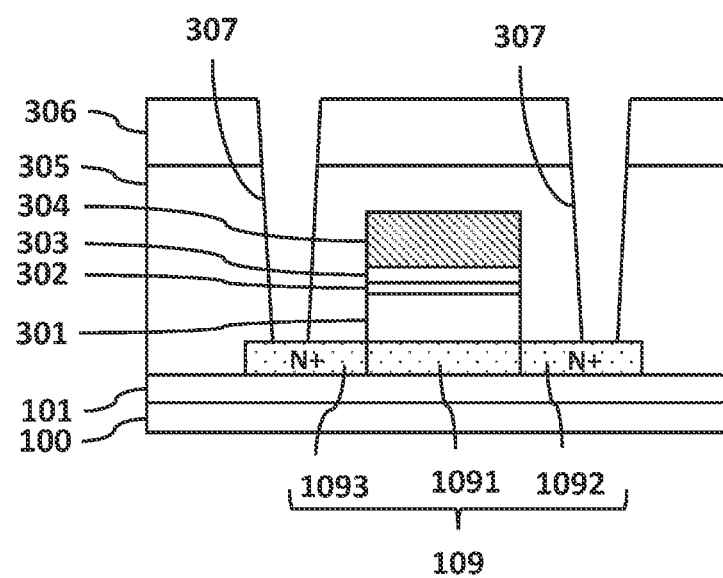
FIG. 35 is a cross sectional view showing a state where contact holes are formed.

FIG. 35 is a cross sectional view showing a state where the contact hole 307 is formed. The contact hole 307 is formed by dry etching using a CF-based gas (e.g. CF4), or CHF-based gas (e.g. CHF3), for example. The contact hole 307 is formed in the insulating films (306 and 305) such that the drain region 1092 and the source region 1093 are exposed.

After that, the source-drain electrode wire 308 is formed in the contact hole 307. As described above, as shown in FIG. 25, the semiconductor device 10c including the thin film transistor (OSTFT) using the oxide semiconductor (OS) is formed.

All display devices that can be embodied by a person skilled in the art by appropriately modifying designs based on the above-described display devices according to the embodiment of the present invention also belong to the scope of the present invention as long as the gist of the present invention is included.

In the scope of the ideas of the present invention, a person skilled in the art can conceive various exemplary modifications and exemplary alterations, and it is understood that these exemplary modifications and exemplary alterations are also included in the scope of the present invention. For example, ones to which a component is appropriately added or removed, or design is changed on the forgoing embodiments by a person skilled in the art, or ones to which a step is added or removed, or conditions are changed are included in the scope of the present invention as long as the gist of the present invention is included.

On other operations and effects derived from the forms described in the present embodiment, it is understood that ones apparent from the description of the present specification or ones appropriately conceived by a person skilled in the art are naturally derived from the present invention.

Various inventions can be formed from appropriate combinations of a plurality of components disclosed in the foregoing embodiment. For example, some components may be removed from the components shown in the embodiment. Moreover, components across different embodiments may be appropriately combined.

What is claimed is:

1. A semiconductor device comprising a thin film transistor having an oxide semiconductor,
   wherein the oxide semiconductor has a drain region, a source region, and a channel region provided between the drain region and the source region,
   the thin film transistor includes a gate insulating film provided on the channel region, an aluminum oxide film provided on the gate insulating film, a first insulating film provided on the aluminum oxide film, and a gate electrode provided on the insulating film;
   the aluminum oxide film does not dispose on the drain region and the source region, a second insulating film is provided covering the thin film transistor, and the second insulating film is directly contact with the drain region and the source region.

2. The semiconductor device according to claim 1, wherein the first insulating film is an SiO film formed at a low temperature in comparison with the gate insulating film.

3. The semiconductor device according to claim 1, wherein a film forming temperature of the first insulating film is 250° C.

4. The semiconductor device according to claim 1, wherein the first insulating film includes many defects in comparison with the gate insulating film.

5. The semiconductor device according to claim 1, wherein a film thickness of the aluminum oxide film ranges from 10 nm to 50 nm; and a film thickness of the first insulating film ranges from 40 nm to 80 nm.

6. The semiconductor device according to claim 1, wherein the oxide semiconductor is IGZO.

7. The semiconductor device according to claim 1, wherein the semiconductor device is a semiconductor device that is built in a display panel having a display region including a pixel; and the thin film transistor constitutes a switching device provided on the pixel.

8. The semiconductor device according to claim 1, wherein the second insulating film comprises SiN.

* * * * *